United States Patent
Pawlowski

(10) Patent No.: US 11,422,884 B2
(45) Date of Patent: Aug. 23, 2022

(54) SPARE SUBSTITUTION IN MEMORY SYSTEM

(71) Applicant: Micron Technology, Inc., Boise, ID (US)

(72) Inventor: Joseph Thomas Pawlowski, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/211,280

(22) Filed: Mar. 24, 2021

(65) Prior Publication Data

US 2021/0208964 A1 Jul. 8, 2021

Related U.S. Application Data

(62) Division of application No. 16/516,916, filed on Jul. 19, 2019, now Pat. No. 10,990,472.

(Continued)

(51) Int. Cl.
*G11C 29/44* (2006.01)
*G06F 11/07* (2006.01)
(Continued)

(52) U.S. Cl.
CPC ........ *G06F 11/102* (2013.01); *G06F 11/0793* (2013.01); *G06F 11/1012* (2013.01);
(Continued)

(58) Field of Classification Search
CPC ............... G06F 11/102; G06F 11/0793; G06F 11/1012; G06F 11/1044; G11C 16/24; G11C 16/26
See application file for complete search history.

(56) References Cited

U.S. PATENT DOCUMENTS 4,480,307 A 10/1984 Budde et al.
4,584,681 A 4/1986 Singh et al.
(Continued)

FOREIGN PATENT DOCUMENTS

KR 20090024495 A 3/2009

OTHER PUBLICATIONS

ISA/KR, International Search Report and Written Opinion of the International Searching Authority, Int'l. Appl. No. PCT/US2019/043050, Nov. 8, 2019, Korean Intellectual Property Office, Seo-gu, Daejeon, Republic of Korea, 10 pgs.
(Continued)

*Primary Examiner* — Guy J Lamarre
(74) *Attorney, Agent, or Firm* — Holland & Hart LLP

(57) ABSTRACT

Methods, systems, and devices for spare substitution in a memory system are described. A controller may, as part of a background operation, assign a spare bit to replace a bit of a code word and save an indication of the spare bit assignment in a memory array. The code word may include a set of bits that each correspond to a respective Minimum Substitution Region (MSR) within a memory medium that retains the code word. An MSR corresponding to the bit to be replaced may include a quantity of erroneous bits relative to a threshold. The controller may, during a read operation, identify the spare bit in a first portion of the code word, determine the bit to be replaced based on accessing the memory array, and replace the bit with the spare bit concurrently with receiving a second portion of the code word.

20 Claims, 8 Drawing Sheets

Related U.S. Application Data

(60) Provisional application No. 62/702,808, filed on Jul. 24, 2018.

(51) Int. Cl.
    *G06F 11/14*     (2006.01)
    *G11C 29/02*     (2006.01)
    *G11C 29/38*     (2006.01)
    *G11C 29/50*     (2006.01)
    *G06F 11/30*     (2006.01)
    *G06F 11/10*     (2006.01)
    *G11C 16/24*     (2006.01)
    *G11C 16/26*     (2006.01)

(52) U.S. Cl.
    CPC ......... *G06F 11/1044* (2013.01); *G11C 16/24* (2013.01); *G11C 16/26* (2013.01)

(56) References Cited

U.S. PATENT DOCUMENTS

| | | | |
|---|---|---|---|
| 4,584,682 A | 4/1986 | Shah et al. | |
| 5,648,934 A | 7/1997 | Otoole | |
| 5,825,788 A | 10/1998 | Pawlowski | |
| 5,862,154 A | 1/1999 | Pawlowski | |
| 6,675,344 B1 | 1/2004 | Sharma | |
| 7,187,307 B1 | 3/2007 | Schmidt et al. | |
| 9,640,281 B1* | 5/2017 | Seo | G06F 3/0679 |
| 9,715,424 B1 | 7/2017 | Ware et al. | |
| 10,949,293 B2* | 3/2021 | Pawlowski | G06F 11/1012 |
| 2005/0022065 A1 | 1/2005 | Dixon et al. | |
| 2007/0050688 A1 | 3/2007 | Thayer | |
| 2010/0185897 A1 | 7/2010 | Abts et al. | |
| 2014/0146624 A1 | 5/2014 | Son et al. | |
| 2014/0157054 A1 | 6/2014 | Yoon et al. | |
| 2014/0376320 A1 | 12/2014 | Loh et al. | |
| 2015/0071018 A1 | 3/2015 | Kang et al. | |
| 2015/0277787 A1* | 10/2015 | Takubo | G06F 3/0616 711/103 |
| 2016/0041869 A1* | 2/2016 | Davis | H03M 13/3761 714/773 |
| 2018/0219562 A1 | 8/2018 | Lee et al. | |
| 2019/0065237 A1 | 2/2019 | Lee et al. | |
| 2019/0354305 A1 | 11/2019 | Pawlowski | |
| 2019/0354479 A1 | 11/2019 | Pawlowski | |
| 2020/0034225 A1 | 1/2020 | Pawlowski | |
| 2020/0034228 A1 | 1/2020 | Pawlowski | |

OTHER PUBLICATIONS

European Patent Office, "Extended Search Report," issued in connection with European Patent Application No. 19841183.7, dated Nov. 9, 2021 (7 pages).

* cited by examiner

SPARE SUBSTITUTION IN MEMORY SYSTEM

CROSS REFERENCE

The present Application for Patent is a divisional of U.S. patent application Ser. No. 16/516,916 by Pawlowski, entitled "SPARE SUBSTITUTION IN MEMORY SYSTEM" filed Jul. 19, 2019, which claims priority to U.S. Provisional Patent Application No. 62/702,808 by Pawlowski, entitled "SPARE SUBSTITUTION IN MEMORY SYSTEM" filed Jul. 24, 2018, assigned to the assignee hereof and each of which is expressly incorporated by reference in its entirety.

BACKGROUND

The following relates generally to operating a memory subsystem or system and more specifically to spare substitution in a memory system.

A computing system may include a memory subsystem or system including various kinds of memory devices and controllers that are coupled with one or more buses to manage information in numerous electronic devices such as computers, wireless communication devices, internet of things, cameras, digital displays, and the like. Memory devices are widely used to store information in such electronic devices. Information is stored by programing different states of a memory device. For example, binary devices have two states, often denoted by a logic "1" or a logic "0." In other systems, more than two states may be stored in memory devices. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous DRAM (SDRAM), ferroelectric RAM (FeRAM), magnetic RAM (MRAM), resistive RAM (RRAM), flash memory, not-AND (NAND) memory, phase change memory (PCM), and others. Memory devices may be volatile or non-volatile. Non-volatile memory cells may maintain their logic states for extended periods of time even in the absence of an external power source. Volatile memory devices, e.g., DRAM, may lose their stored state when disconnected from an external power source.

Improving a computing system may include enhancing a memory system's performance, such as reducing power consumption, increasing memory capacity and reliability, improving read/write speeds, providing non-volatility by use of persistent memory media, or reducing manufacturing costs at a certain performance point, among other metrics.

DETAILED DESCRIPTION

Figure 1:
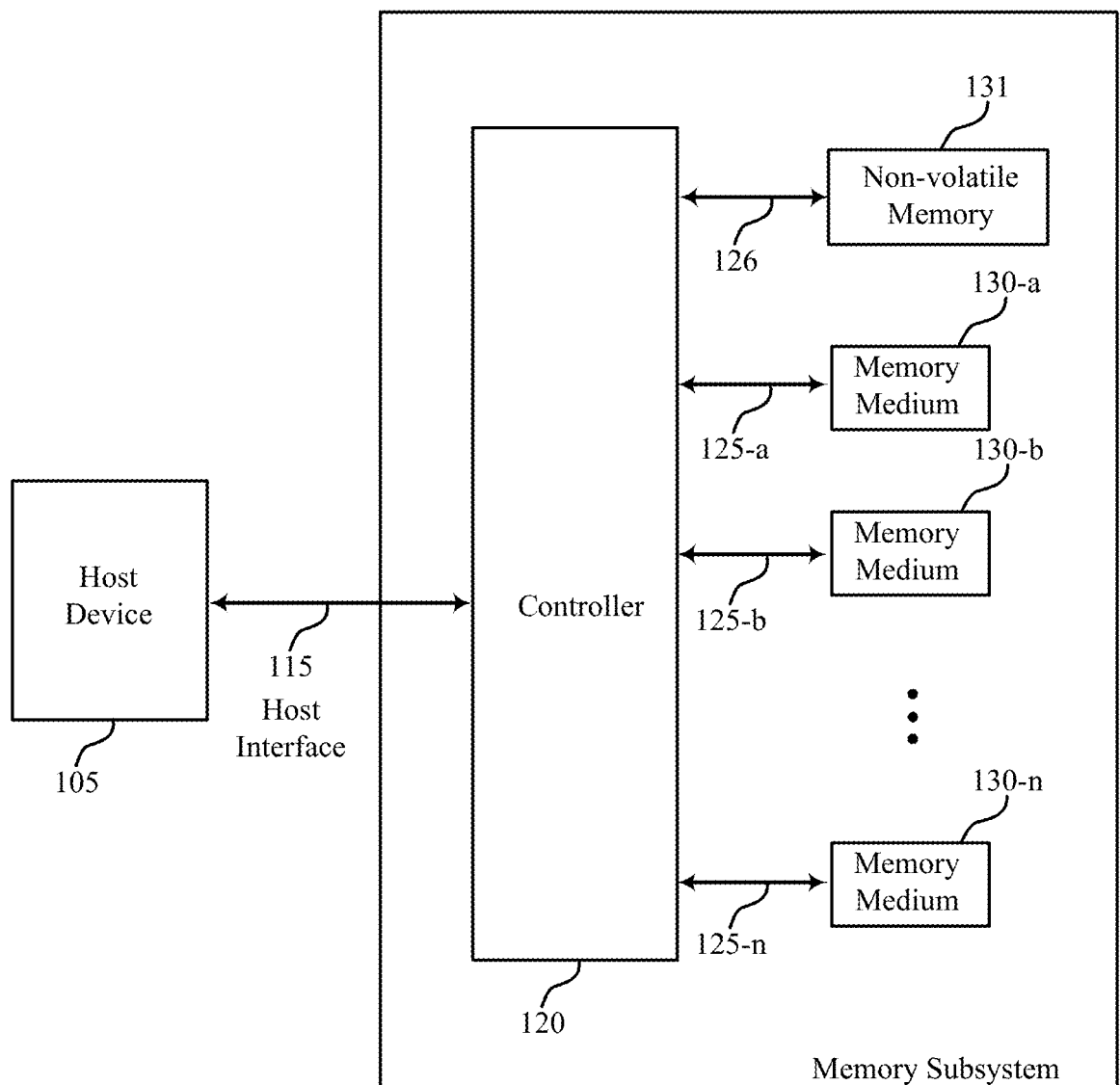
FIG. 1 illustrates an example of a computing system that supports spare substitution in a memory system in accordance with aspects disclosed herein.

Performance of a computing system (e.g., a server including a memory system or subsystem) may depend on various factors, such as supplying reliable information to the computing system with a low latency (e.g., a load-to-use latency). In the context of a computing system or subsystem, data carrying information may be referred to as a code word. In some cases, a code word may include an amount of user data and additional bits (e.g., bits supporting an error control operation) carrying various information to provide reliable user data with a low latency. A code word may be associated with elements of a computing system, such as a memory medium of a memory system or subsystem, and may be transmitted and received during one or more access operations, or a background operation, or both. A background operation in a computing system may refer to a process that runs without a user intervention (e.g., an access command from a host device).

In some cases, memory cells of one or more memory dice in a memory medium may support a finite quantity of access operations (e.g., read cycles, or write cycles, or both) before becoming unreliable or problematic. When a memory cell is unreliable, information the memory cell produces may become faulty or invalid, and such a memory cell (or information produced by the memory cell) may be referred to as an erroneous bit. When a quantity of memory cells associated with a code word generates erroneous bits, the code word (e.g., user data in the code word) may become faulty or invalid beyond an error recovery capability of a memory system or subsystem. Thus, substituting erroneous bits in a code word with spare bits may improve a system's reliability by providing reliable data to a host. Further, concepts disclosed herein may support spare substitution without introducing a significant delay and may facilitate low-latency operations of the computing system.

A memory array of a memory die may be configured to include a set of Minimum Substitution Regions (MSRs). An MSR may be configured as a reasonable fault containment zone to efficiently manage (e.g., replace, substitute) erroneous bits in the memory array. In some cases, an MSR may include a group of memory cells configured as a unit of data associated with an error control operation. Further, at least some, if not each, MSRs of the set may be associated with a counter configured to count a quantity of erroneous bits in the MSRs of the set. A group of MSRs across a set of channels of the memory medium (e.g., a group of MSRs operating in parallel) may retain a quantity of code words. The group of MSRs configured to produce the quantity of code words may be referred to as an MSR strip or an MSR region, in some cases.

A controller (e.g., a port manager associated with the memory medium) may, as part of a background operation in some cases, read a code word from a memory medium that includes a set of MSRs. The code word may include a plurality of bits that each correspond to a respective MSR of the set. The controller may identify a quantity of erroneous bits in the code word using an error control operation and set values of counters associated with MSRs of the set corresponding to the quantity of erroneous bits. Further, the controller may determine a value of a counter relative to a threshold, where the counter is associated with an MSR that includes at least one erroneous bit of the quantity, and assign a spare bit of the code word to replace the erroneous bit (e.g., the MSR corresponding to the erroneous bit). The controller may write an indication of the spare bit assignment with respect to the erroneous bit, which may include saving the indication in a separate memory array (e.g., static random access memory (SRAM) cells) that may be configured to save such indications. In some cases, the controller may transfer information (e.g., one or more indications of spare bit assignments) to a non-volatile memory before a power change or loss incident.

A controller may, during a read operation, identify a spare bit in a first portion of the code word to determine the erroneous bit to be replaced based on accessing the memory array (e.g., SRAM cells) that includes the spare bit assignment indication. The controller may, in some cases, replace the erroneous bit with the spare bit concurrently with receiving a second portion of the code word. The code word may have been configured according to a code word format that supports a low latency operation to produce reliable user data to a host with the spare bit in place. For example, the first portion of the code word may correspond to a first data burst (e.g., an initial data burst) that includes one or more spare bits and the second portion of the code word may correspond to one or more additional data bursts that temporally follow the initial data burst. In this manner, a spare bit (e.g., a spare bit replacing an erroneous bit during a read operation) may be multiplexed with a series of data bursts into a bit stream of the code word adding minimal or essentially no additional latency (other than the latency of the multiplexing component).

Features of the disclosure introduced herein are further described below at an exemplary system level in the context of FIG. 1. Specific examples of a system and a configuration of a memory medium of the system are then described in the context of FIGS. 2 through 4. These and other features of the disclosure are further illustrated by and described with reference to an apparatus diagram of FIG. 5 that describes various components related to a controller as well as flowcharts of FIGS. 6 through 8 that relate to operations of spare substitution in a memory system.

FIG. 1 illustrates an example of a computing system 100 that supports spare substitution in a memory system in accordance with aspects disclosed herein. The computing system 100 may include a host device 105 coupled with a device 140 through a host interface 115 (which may also be referred to as a host link). The host device 105 may be or include a server, a system on a chip (SoC), a central processing unit (CPU), or a graphics processing unit (GPU), among other examples. In some examples, the host device 105 may access (e.g., read from, write to) one or more memory media 130 located in the device 140 through the host interface 115.

The host interface 115 (e.g., a host link) may be compatible with or employ a protocol (e.g., the Gen-Z, the Cache Coherent Interconnect for Accelerators (CCIX) protocol) to facilitate access operations between the host device 105 and the one or more memory media 130. The host interface 115 may be configured to transfer data at a first data transfer rate (e.g., 25 gigabytes per second (GBps)) in at least one direction (e.g., sending or receiving). In some examples, a 25 GBps data transfer rate may support approximately 586 million transactions per second when a transaction size is 64 bytes. In other examples, a 25 GBps data transfer rate may support approximately 312.5 million transactions per second when a transaction size is 128 bytes.

The device 140 may, in some cases, be referred to as a memory system or subsystem, or a memory device. In some cases, the device 140 may include a power management component. The power management component may monitor a power level that may indicate a power change or loss related to the device 140 or the computing system 100. In some cases, the power level may fluctuate beyond a normal range to indicate such a power change or loss incident. The device 140 may include a controller 120 that may be coupled with one or more memory media 130 through channels 125. In some cases, the channels 125 may be referred to as aggregated channels 125 including a plurality of other channels (e.g., channels having a smaller bandwidth than the aggregated channel 125) as described with reference to FIG. 2. The device 140 may include a non-volatile memory 131 that is coupled with the controller 120 through a channel 126. In some examples, the controller 120, the one or more memory media 130, or the non-volatile memory 131, or any combination thereof, may be integrated with, in contact with, or placed on a board (e.g., a peripheral component interconnect express (PCIe) board). In some cases, the non-volatile memory 131 may be integrated as part of the controller 120.

The controller 120 may include various functional blocks that facilitate operations of the device 140 in conjunction with the one or more memory media 130. In some case, the power management component may be integrated as part of the controller 120. In some cases, the controller 120 may include aspects of an interface controller to accommodate different specifications, constraints, or characteristics associated with the host interface 115, the channels 125, the channel 126, or any combination thereof. In some examples, the controller 120 may be an ASIC, a general-purpose processor, other programmable logic device, discrete hardware components (e.g., a chiplet), or it may be a combination of components.

In some cases, the controller 120 may read data from or write data to a memory medium 130 (e.g., a memory medium 130-a) in conjunction with a local controller (e.g., local to the memory medium 130-a) that may perform various operations (e.g., writing data to memory cells, reading data from memory cells, arranging a code word in accordance with a code word format described with reference to FIG. 3). In some examples, the local controller may send requested data to the controller 120 through one of the channels 125, which may be an example of an aggregated channel.

Each memory medium (e.g., a memory medium 130-a) may include multiple memory dice (e.g., forty-four (44) memory dice) to obtain a specified or desired memory capacity of the memory medium. In some examples, the memory dice may include a three-dimensional cross-point array of memory cells, which may include structures or components formed from a chalcogenide (e.g., 3DXP memory dice including 3D XPoint™ memory cells). In other examples, the memory dice may include other kinds of memory devices (e.g., FeRAM dice, MRAM dice, PCM dice). In some examples, a code word (e.g., a code word including 128 bytes of user data) may be divided across the multiple memory dice within a memory medium (e.g., a memory medium 130-a).

In some cases, each memory die (e.g., each 3DXP memory die) of the multiple memory dice may produce a quantity of data (e.g., 128 bits of data) as a unit from the memory die in association with an access operation (e.g., a read operation). The amount of data (e.g., 128 bits of data) may include a sequence of bursts (e.g., sixteen (16) bursts), each burst including an amount of data (e.g., eight (8) bits of data) transmitted over a bus (e.g., 8-bits wide bus) from the memory die. As an example, when a memory medium includes eleven (11) memory dice operating in parallel, and when each memory die of the eleven (11) memory dice produces eight (8) bits of data at a given burst, the memory medium may produce 88 bits of data for the given burst. As eleven (11) memory dice may produce data over a total of sixteen (16) bursts, each burst including 88 bits of data from eleven (11) memory dice, a unit of data associated with the memory medium during an access operation—e.g., the unit of data transmitted over the channel (e.g., an aggregated channel)—may include 1,408 bits.

As such, a code word (e.g., a unit of data during a transaction of an access operation) associated with a memory medium may include 1,408 bits, in this example. In some cases, a burst may be referred to as a channel burst or a data burst. In some cases, a channel between the controller 120 and a memory medium (e.g., a memory medium 130-*a*) may include a plurality of channels, in which each channel may be associated with one or more memory dice of the memory medium (e.g., a memory medium 130-*a*) as described with reference to FIGS. 3 and 4.

A memory medium (e.g., a memory medium 130-*a*) may include a set of memory dice that each include a memory array. Each memory die of the set (e.g., each memory array) may be configured to include a set of MSRs as described with reference to FIG. 4. An MSR may be configured as a reasonable fault containment zone to efficiently manage (e.g., replace, substitute) erroneous bits in the memory array. Further, at least some, if not each, MSRs of the set may be associated with a counter configured to count a quantity of erroneous bits in the MSRs of the set.

The channels 125 may be configured to transport data (e.g., a code word) between the controller 120 and the one or more memory media 130. Each of the channels 125 (e.g., the channel 125-*a* that may be an example of an aggregated channel) may include a plurality of other channels (e.g., channels having a smaller bandwidth than the channel 125-*a*) for transporting data (e.g., a code word) in parallel. In some cases, a code word may include user data (e.g., 128 bytes of user data in a code word) and other set of data (e.g., remaining data in the code word to produce reliable data with a low latency). Each of the channels 125 (e.g., the channel 125-*a* that may be an example of an aggregated channel) may include additional channels to carry information related to various auxiliary functions such as metadata. In some cases, a code word format (which may also be referred to as a code word layout) or a forwarded code word format (e.g., a forwarded code word layout) may define how each of the channels 125 (e.g., the channel 125-*a*) may transport data (e.g., a code word) between the controller 120 and the one or more memory media 130.

The non-volatile memory 131 may include an array of non-volatile memory cells that may maintain their logic states for an extended period of time even in the absence of an external power source. For example, the non-volatile memory cells may be or include 3D XPoint™ memory cells, PCM cells, FeRAM cells, or flash (e.g., NAND flash, NOR flash) memory cells, among other examples. Further, the non-volatile memory 131 may be configured to communicate information with the controller 120 through the channel 126. For example, the non-volatile memory 131 may receive information from the controller 120 through the channel 126 and save the information when a power change or loss related to the computing system 100 is detected.

In some cases, the memory subsystem or system, which may include device 140, may include a power management component to manage a power change or loss incident. The power management component may be operable to detect a sign of power change or loss (e.g., a power level indicating a power change or loss that may occur) and transmit an indication of the sign of power change or loss to the controller 120. The controller 120 may, upon receiving the indication, transfer information (e.g., an indication of error status associated with a code word, one or more indications of spare bit assignments to erroneous bits) saved in a memory array (e.g., SRAM memory array) in the controller 120 to the non-volatile memory 131. The non-volatile memory 131 may save the information such that the information may be preserved in the absence of a power supply to the memory subsystem or system, which may include device 140. When the power to the computing system 100 is restored or otherwise adjusted, the controller 120 may retrieve the information from the non-volatile memory 131 to resume an operation that has been interrupted by the power change or loss incident based on the information preserved in the non-volatile memory 131.

The controller 120 may, as part of one or more background operations in some cases, read a code word from a memory medium (e.g., a memory medium 130) that includes a set of MSRs. The code word may include a plurality of bits that may each correspond to a respective MSR of the set. The controller 120 may identify a quantity of erroneous bits in the code word using an error control operation and set (e.g., initially set, update) a value of a counter associated with an MSR of the set (e.g., an MSR of the set that includes an erroneous bit of the quantity) based on identifying the quantity of erroneous bits in the code word. Further, the controller 120 may determine the value of the counter relative to a threshold and assign a spare bit of the code word to the erroneous bit of the quantity based on the value of the counter relative to the threshold. In some cases, the threshold may be referred to as a bit-level replacement threshold.

In some cases, the controller 120 may write an indication of the spare bit assignment with respect to the erroneous bit of the quantity to a memory array of the controller 120 based on assigning the spare bit of the code word. The memory array may be configured to save a plurality of such indications associated with spare bits and may include SRAM cells. In some cases, the controller 120 may configure (e.g., program, adjust) the threshold with respect to an error rate, such as a raw bit error rate (RBER), associated with the memory medium based on identifying the quantity of erroneous bits in the code word. In other cases, the controller 120 may configure the threshold with respect to a size of an MSR of the set based on identifying the quantity of erroneous bits in the code word.

Figure 2:
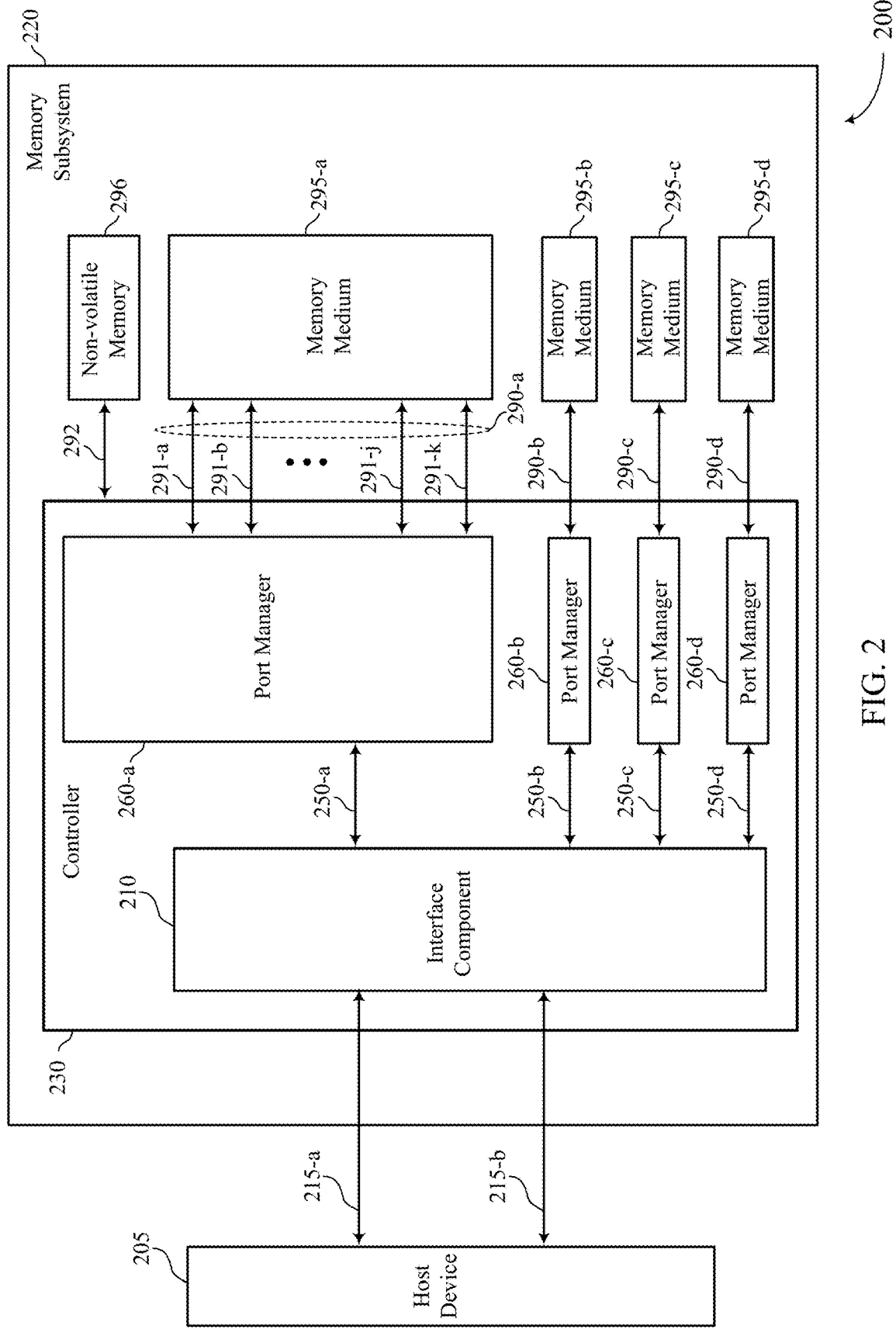
FIG. 2 illustrates an example of a computing system that supports spare substitution in a memory system in accordance with aspects disclosed herein.

FIG. 2 illustrates an example of a computing system 200 that supports spare substitution in a memory system in accordance with aspects disclosed herein. The computing system 200 may be an example of the computing system 100 described with reference to FIG. 1. The computing system 200 may include a host device 205 coupled with a memory subsystem or system 220 using at least one host interface (e.g., a host interface 215-*a*). In some cases, the host interfaces 215 may be referred to as a host link or host links. The host device 205 may be an example of the host device 105 described with reference to FIG. 1. The host interfaces 215 may be examples of the host interface 115 described with reference to FIG. 1. In some examples, the host interfaces 215 may be configured to transfer data at a first data transfer rate (e.g., 50 GBps with 25 GBps in each direction).

The computing system 200 may include the memory subsystem or system 220. The memory subsystem or system 220 may be an example of the device 140 described with reference to FIG. 1. The memory subsystem or system 220 may be referred to as a memory device or memory devices. The memory subsystem or system 220 may include a controller 230. In some cases, the memory subsystem or system 220 may include a power management component. The power management component may monitor a power level that may indicate a power change or loss related to the memory subsystem or system 220 or the computing system 200. In some cases, the power level may fluctuate beyond a normal range to indicate such a power change or loss incident. The controller 230 may be an example of the controller 120 described with reference to FIG. 1. The controller 230 may include an interface component 210 and a plurality of port managers 260. In some cases, the power management component may be integrated as part of the controller 230.

The interface component 210 may be configured to facilitate data exchange between the host device 205 and the memory subsystem or system 220 through the host interfaces 215. The interface component 210 may be configured to exchange data with the plurality of port managers 260 (e.g., using signal paths 250). Each signal path of the signal paths 250 may be configured to exchange data at a rate (e.g., 12.8 GBps) different than the first data transfer rate of the host interfaces 215. In some cases, the interface component 210 may be configured to provide a routing network function to allow more than one host interface (e.g., host interface 215-$a$ and host interface 215-$b$) to be associated with the plurality of port managers 260.

The memory subsystem or system 220 may include a non-volatile memory 296. The non-volatile memory 296 may be configured to communicate information with the controller 230 through a channel 292. The non-volatile memory 296 may be an example of the non-volatile memory 131 described with reference to FIG. 1. Also, the channel 292 may be an example or include aspects of the channel 126 described with reference to FIG. 1. Further, the non-volatile memory 296 may be configured to communicate information with port managers 260 in the controller 230. For example, the port managers 260 may transfer various information (e.g., one or more indications of spare bit assignments to erroneous bits) to the non-volatile memory 296 through the channel 292 and save the information in the non-volatile memory 296 when the port managers 260 receive an indication of a power change or loss related to the computing system 200 or the memory subsystem or system 220. In some cases, the non-volatile memory 296 may be integrated as part of the controller 230.

Each port manager (e.g., the port manager 260-$b$) of the plurality of the port managers 260 may be coupled with a memory medium (e.g., the memory medium 295-$b$) through an aggregated channel (e.g., the aggregated channel 290-$b$). In some cases, each port manager of the plurality may be coupled with different one or more memory media 295. In some examples, an individual port manager (e.g., the port manager 260-$a$) of the plurality of port managers 260 may operate independent of each other (e.g., the port managers 260-$b$, 260-$c$, and 260-$c$) and may support access operations or background operations associated with one or more memory media 295. The one or more memory media 295 may be examples of the one or more memory media 130 described with reference to FIG. 1. In some cases, each of the one or more memory media 295 may be referred to as a media port.

Each aggregated channel of the aggregated channels 290 may include one or more channels 291. In some cases, the channels 291 may be referred to as logic channels 291. In some examples, each channel 291 may be associated with one or more memory dice in a memory medium (e.g., the memory medium 295-$a$) and may have a smaller bandwidth than the bandwidth of the aggregated channel (e.g., the aggregated channel 290-$b$). In some examples, an aggregated channel (e.g., an aggregated channel 290-$a$) may include eleven (11) channels 291 (e.g., channels 291-$a$ through 291-$k$). For the sake of clarity, the plurality of channels 291 (e.g., the channels 291-$a$ through the channel 291-$k$) are depicted for the port manager 260-$a$ representing one of the aggregated channels 290 (e.g., the aggregated channel 290-$a$) while the other aggregated channels 290 (e.g., the aggregated channels 290-$b$, 290-$c$, and 290-d) are depicted for port managers 260-$b$, 260-$c$, and 260-d without showing the plurality of channels 291 associated with each aggregated channel.

An individual memory medium (e.g., the memory medium 295-$a$) of the one or more memory media 295 may include one or more memory devices (e.g., 3DXP memory dice). In some cases, the memory devices in the individual memory medium may be configured to operate in parallel to obtain a desired (or a specified) aggregated bandwidth through one of the aggregated channels 290. A 3DXP memory die, as one example, may be configured to have a 8-bits wide data bus and may be associated with each of channels 291 (e.g., the channel 291-$a$) rendering each channel 291 being 8-bits wide. In addition, a 3DXP memory die may be configured to produce 128-bits of data during a sequence of sixteen (16) bursts, in which each burst may produce 8-bits wide data over the channel 291. As such, 128-bits of data may be considered as a single unit of data that each 3DXP memory die generates based on an access command (or during a background operation) reading memory cells within the 3DXP memory die.

In some cases, a code word (or a forwarded code word) may be configured to include a set of bit fields indicative of a plurality of data bursts (e.g., a sequence of sixteen (16) bursts) across a plurality of channels (e.g., eleven (11) channels 291-$a$ through 291-$k$ generating 88 bits of data per data burst). As such, the code word may in some cases include 1,408 bits of information. The description herein may be understood from a logical view of the memory medium. A larger quantity of physical 3DXP memory dice than a quantity of logical 3DXP memory dice may be present in a memory medium accounting for an overhead related to various access operations (e.g., read operation, write operation) or background operations associated with the memory medium. Within a memory medium, a code word may be divided into parts and written to or read from more than one die (e.g., 128 byte user data retained across ten (10) 3DXP memory dice) as described with reference to FIG. 3.

Various examples described herein use 3DXP memory dice (e.g., including 3D) XPoint™ memory cells) to illustrate how the memory media 295 may be configured and operate in conjunction with the port managers 260 in accordance with the methods, devices, and systems supporting spare substitution in a memory system disclosed herein. In some cases, the memory media 295 may include other types of memory devices employing different memory technologies than 3DXP memory technology, such as FeRAM technology, PCM technology, MRAM technology, among others. As such, the concepts disclosed herein are not limited to a particular memory technology (e.g., 3D XPoint™ memory technology).

A memory medium (e.g., a memory medium 295-a) may include a set of memory dice that each include a memory array. Each memory die of the set (e.g., each memory array) may be configured to include a set of MSRs as described with reference to FIG. 4. An MSR may be configured as a reasonable fault containment zone to efficiently manage (e.g., replace, substitute) erroneous bits in the memory array. In some cases, each bit of a code word (e.g., each of 1,408 bits in a code word) may be associated with a respective MSR of the set (e.g., 1,408 MSRs). A group of MSRs across a set of channels of a memory medium (e.g., channels 291-a through 291-k of the memory medium 295-a) may be configured to operate in parallel to retain or to generate a quantity of code words. The group of MSRs configured to produce the quantity of code words may be referred to as an MSR strip or an MSR region, in some cases. Further, at least some, if not each, MSRs of the set may be associated with a counter configured to count a quantity of erroneous bits in the MSRs of the set.

In some cases, a port manager (e.g., a port manager 260-a) may, as part of a read operation, receive a first portion of a code word from a memory medium (e.g., the memory medium 295-a). The code word may include a set of bit fields indicative of a plurality of data bursts across a plurality of channels (e.g., channels 291-a through 291-k). The port manager may identify a spare bit in the first portion of the code word to replace a bit field of the set. The port manager may determine, based on identifying the spare bit, the bit field of the set to be replaced by the spare bit. The port manager may also receive a second portion of the code word (e.g., one or more other data bursts) including the bit field of the set to be replaced by the spare bit. In some cases, the port manager may replace the bit field of the set in the second portion of the code word with the spare bit (e.g., concurrently with receiving the second portion of the code word). As such, the spare bit may be multiplexed with a series of data bursts into a bit stream of the code word adding minimal or essentially no additional latency (other than the latency of the multiplexing component).

In some cases, the port manager may access a memory array of the port manager to determine the bit field of the set in the second portion of the code word to be replaced by the spare bit. The memory array may be configured to retain an indication of a spare bit assignment to a bit field of the set of the code word and may include SRAM cells. In some cases, the port manager may perform an error control operation for the code word based on replacing the bit field of the set in the second portion with the spare bit. In some cases, a size of the memory array (e.g., SRAM cells) for retaining the indication of the spare bit assignment may be based on an identification of a channel of the plurality, a quantity of spare bits in the code word, an identification of one or more MSR of a quantity of MSRs associated with the code word, a quantity of bits associated with forwarded code words in the memory medium, an error correction capability for an indication of a spare bit assignment, a quantity of memory dice corresponding to a channel of the plurality, a quantity of MSRs in a memory die of the quantity, or a bit indicating a change in a spare bit assignment, or any combination thereof, among other examples.

Figure 3:
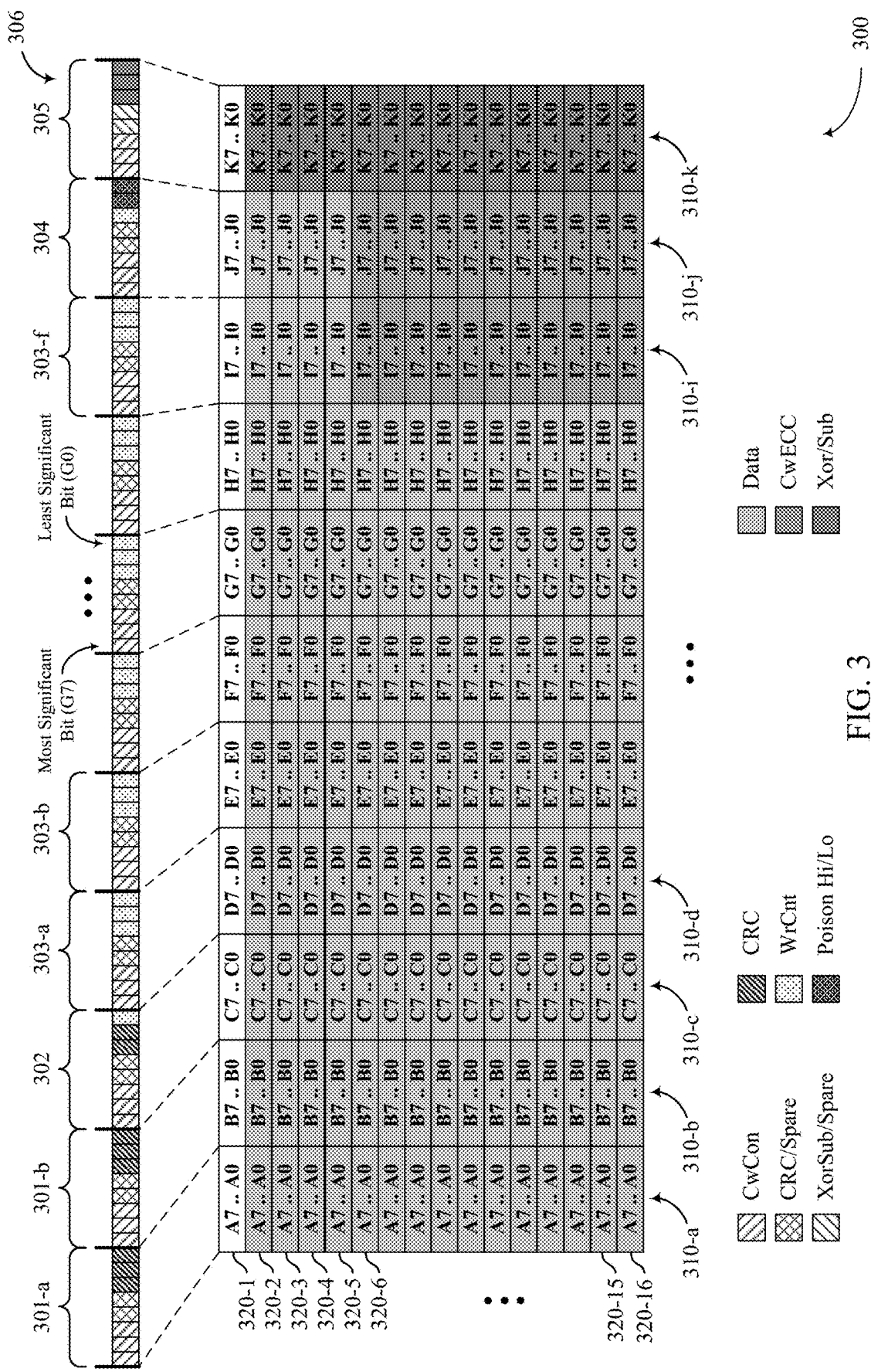
FIG. 3 illustrates an example of a code word format that supports spare substitution in a memory system in accordance with aspects disclosed herein

FIG. 3 illustrates an example of a code word format 300 (which may also be referred to as a code word layout 300) that supports spare substitution in a memory system in accordance with aspects disclosed herein. The code word format 300 may be an example of a code word format for an entire code word. A code word may include a set of bit fields indicative of a plurality of data bursts across a plurality of channels (e.g., channels 291-a through 291-k described with reference to FIG. 2). FIG. 3 also includes formats 301 through 305 (also referred to as layouts) illustrating various configurations for an individual channel (e.g., the channel 291-a described with reference to FIG. 2). FIG. 3 also illustrates a format 306, which may correspond to a portion of a code word (e.g., a subset of bit fields during one or more first data bursts across the plurality of channels).

As an example of a code word format and structure, the code word format 300 may include a quantity of fields (e.g., bit fields) of data (e.g., 1,408 bits of data) that may be produced by a memory medium (e.g., the memory medium 130-a or the memory medium 295-a described with reference to FIGS. 1 and 2) in response to an access command, or during a background operation, or both. The code word may include 128 bytes (e.g., 1,024 bits) of user data. Remaining bit fields within the code word (e.g., 384 bits of data) may carry various information that may facilitate transferring of accurate user data during an access operation, or during a background operation, or both. Further, the remaining bits carrying the various information may be configured to facilitate low latency operations (e.g., spare substitution) associated with the code word during an access operation.

The code word format 300 may span a plurality of channels (e.g., channels 310-a through 310-k). One of these channels (e.g., channels 310-a through 310-k) may be an example of or include aspects of a channel 291 (e.g., a channel 291-a) described with reference to FIG. 2. In some cases, each channel (e.g., the channel 310-a) of the plurality of channels 310 may be associated with one or more 3DXP dice, which may include an 8-bit wide data bus. For example, each channel may produce a total of 128 bits of data as a single object of a transaction (e.g., communication, operation) associated with an access command (e.g., a read command), or a background operation, or both. Further, the 128 bits of data may be produced as a sequence of sixteen (16) data bursts, each data burst configured to produce eight (8) bits of data over the 8-bit wide data bus. Hence, each channel (e.g., each of the channels 310-a through 310-k) within a code word format may correspond to 128 bits of data including sixteen (16) groups of 8-bit of data—e.g., G7 . . . G0 for channel 310-g, where G7 . . . G0 may represent a series of eight (8) 0s and is in which G7 may be the most significant bit (e.g., the eighth bit of the series of eight (8) 0s and 1s) and G0 may be the least significant bit (e.g., the first bit of the series of eight (8) 0s and is)), in which each group of sixteen (16) groups of 8-bits of data may be associated with one of sixteen (16) data bursts.

In one example, the code word format 300 may span across eleven (11) channels and each channel of the eleven (11) channels may produce 8-bits of data at each data burst, and a total of 88 bits of data may be produced at each data burst across the eleven (11) channels (e.g., the first data burst 320-1 of 88 bits of data). Thus, the code word format 300 may include 1,408 bits of data (e.g., the first data burst 320-1 through the 16th data burst 320-16 with each data burst producing 88 bits of data) as a single object of a transaction for a memory medium (e.g., the memory medium 130-a or the memory medium 295-a). The code word format 300 may support a reliable transaction (e.g., conveying accurate contents of user data) having a low latency (e.g., a low quantity of clock edges to produce the user data).

Each field (e.g., each bit field) or a set of fields (e.g., a set of bit fields) within a code word may include information that facilitates reliable transactions of user data with low latency. In some cases, one or more fields (e.g., bit fields) within a code word format may be configured to indicate a code word condition (e.g., using one or more CwCon bits). A code word may be configured in one of multiple possible states (e.g., four states) indicated using the CwCon bits. In some cases, one or more fields within a code word format may be configured to indicate a quantity of access operations (e.g., read operations, write operations) associated with the code word (e.g., WrCnt bits). In some cases, one or more fields within a code word format may be configured to indicate that a portion of the code word may be invalid (e.g., using poison bits).

In some cases, one or more fields within a code word format may be configured as cyclic redundancy check (CRC) bits that may identify erroneous bits related to an error control operation. In some cases, one or more fields within a code word format may be configured as code word error control code bits (e.g., CwECC bits) that support an error control operation. In some cases, one or more fields within a code word format may be configured as XOR bits. Each of the XOR bits may include a digital or Boolean logic exclusive OR (XOR) product of corresponding bits of other channels of a respective data burst. As such, the XOR bits may support repairing corresponding bits of other channels and may be referred to as repair bits. In some cases, each XOR bit (e.g., XOR/Sub bits or XORSub bits) may substitute a field within a code word instead of repairing the field.

In some cases, one or more fields within a code word format may be configured as spare bits (e.g., CRC/Spare bits, XORSub/Spare bits). The bits configured as spare bits may be configured as CRC bits or XOR bits (or XORSub bits), among other alternatives. As an example, the code word format 300 depicted in FIG. 3 may include up to twenty-two (22) spare bits—e.g., twenty (20) CRC/Spare bits and two (2) XORSub/Spare bits. Namely, some CRC bits may be configured as spare bits. Similarly, some repair bits (e.g., XORSub bits) may be configured as spare bits. As such, a quantity of spare bits within a code word may be configurable because the quantity of spare bits may be exchangeable for a quantity of the CRC bits or the XORSub bits. In some cases, the quantity of spare bits in a code word may be determined based on a maturity of memory technology (e.g., 3D XPoint™, FeRAM, MRAM technologies) used to build memory media (e.g., memory media 130, memory media 295).

In some cases, spare bits may be configured to operate as spares to replace bits of the code word designated to have failed (e.g., erroneous bits). In some cases, the bits designated to have failed may be associated with an MSR (e.g., an MSR including a quantity of memory cells, which may have become faulty or unreliable) of a memory die. The spare bits (e.g., MSRs corresponding to the spare bits) may be routed (e.g., multiplexed using a multiplexing component) to replace (e.g., substitute) the bits designated to have failed (e.g., MSRs corresponding to the erroneous bits) to support a reliable transaction of the user data within the code word.

Still referring to FIG. 3, various fields (e.g., bit fields) within a code word format may be configured (e.g., arranged) to support a low latency operation during an access operation associated with a memory medium. FIG. 3 includes formats 301 through 305 illustrating various configurations of a group of 8-bits for an individual channel (e.g., each of the channels 310-a through 310-k). For example, each format of the formats 301 through 305 includes a group of eight (8) bits that a memory device (e.g., 3DXP die) within a memory medium (e.g., a memory medium 295-a) may produce at a given data burst. The following describes example formats, although the disclosure herein is not limited to these examples.

Format 301 may include one or more (e.g., three) fields of CwCon bits, one or more (e.g., two) fields of CRC/Spare bits (which may be configured as either CRC bits or spare bits), and one or more (e.g., three) fields of CRC bits. Format 302 may include one or more (e.g., three) fields of CwCon bits, one or more (e.g., two) fields of CRC/Spare bits (which may be configured as either CRC bits or spare bits), one or more (e.g., two) fields of CRC bits, and one or more WrCnt bits (e.g., a counter bit).

Format 303 may include one or more (e.g., three) fields of CwCon bits, one or more (e.g., two) fields of CRC/Spare bits (which may be configured as either CRC bits or spare bits), and one or more (e.g., three) fields of WrCnt bits (e.g., a counter bit). Format 304 may include one or more (e.g., three) fields of CwCon bits, one or more (e.g., two) fields of CRC/Spare bits (which may be configured as either CRC bits or spare bits), one or more fields of WrCnt bits (e.g., a counter bit), and one or more (e.g., two) fields of poison bits (e.g., bits indicating invalidity of a portion of the code word). Format 305 may include one or more (e.g., three) fields of CwCon bits, one or more (e.g., two) fields of XORSub/Spare bits (which may be configured as either XORSub bits or spare bits), and one or more (e.g., three) fields of XORSub bits.

The code word format 300 may also illustrate user data field of 1,024 bits (e.g., channels 310-a through 310-h over the second data burst 320-2 through the 16th data burst 320-16, and channels 310-i and 310-j over the second data burst 320-2 through the fifth data burst 320-5), CwECC fields (e.g., channels 310-i and 310-j over the 6th data burst 320-6 through the 16th data burst 320-16), and XOR/Sub fields (e.g., channel 310-k over the second data burst 320-2 through the 16th data burst 320-16).

As an example of a code word format that supports a low-latency operation, a subset of bit fields corresponding to the first data burst (e.g., the data burst 320-1) may be configured as illustrated in the format 306. In the format 306, each group of 8-bits of channel 310-a (e.g., A7 . . . A0) and channel 310-b (e.g., B7 . . . B0) may be configured to have the format 301. Also, a group of 8-bits of channel 310-c (e.g., C7 . . . C0) may be configured to have the format 302. At least some, if not each, group of 8-bits of channel 310-d (e.g., D7 . . . D0) through channel 310-i (e.g., I7 . . . I0) may be configured to have the format 303. A group of 8-bits of channel 310-j (e.g., J7 . . . J0) may be configured to have the format 304. Further, a group of 8-bits of channel 310-k (e.g., K7 . . . K0) may be configured to have the format 305. As a result of configuring the subset of bit fields (e.g., a total of 88 bits including eight (8) bits from each channel of eleven (11) channels) corresponding to the first data burst (e.g., the first data burst 320-1) of the code word format 300, the first data burst of 88 bits (e.g., the 88 bits of the format 306) may include information to facilitate a low-latency, reliable transaction of an access operation associated with the code word (e.g., reading 1,024 bits of user data). In some cases, a port manager (e.g., a port manager 260-a) may receive a first portion of a code word (e.g., the bits of the format 306 corresponding to the first data burst 320-1) associated with a memory medium. The port manager may parse (e.g., interpret) the first portion of the code word (e.g., identifying spare bits) concurrently with receiving additional portions of the code word (e.g., the bits of the code word format 300 corresponding to a second data burst 320-2, and so on) during subsequent data bursts. As such, the port manager may parallelize various operations associated with the code word to supply reliable, low-latency communication or information exchange with a host.

As an example, within the first data burst (e.g., the first data burst 320-1) as depicted in the format 306, there may be up to twenty-two (22) fields of spare bits, two fields per each channel, across the eleven (11) channels (e.g., channels 310-a through 310-k). In some cases, a controller (e.g., a controller 120 or a port manager 260-a described with reference to FIGS. 1 and 2) may, as part of a read operation, receive a first portion of a code word (e.g., the first data burst 320-1) from a memory medium (e.g., a memory medium 130-a or a memory medium 295-a described with reference to FIGS. 1 and 2). The code word may include a set of bit fields indicative of a plurality of data bursts across a plurality of channels (e.g., channels 310-a through 310-k).

The controller may identify a spare bit in the first portion of the code word (e.g., one of the twenty-two (22) spare bits in the first data burst 320-1) to replace a bit field of the set. The controller may determine, based on identifying the spare bit, the bit field of the set (e.g., D1 bit of the channel 310-d within the third data burst 320-3) to be replaced by the spare bit. Further, the controller may receive a second portion of the code word (e.g., the second data burst 320-2 through 320-16 or any portion thereof, one or more additional data bursts). In some cases, the port manager 260-a may replace the bit field of the set in the second portion of the code word with the spare bit concurrently with receiving the second portion of the code word (e.g., the fourth data burst 320-4 through 320-16 or any portion thereof). That is, in some cases, the port manager 260-a may replace the bit field of the set in the second portion of the code word with the spare bit without increasing the number of clock edges for processing the sequence of data bursts (e.g., 16 data bursts). For example, the port manager 260-a may receive the data burst over a first number of clock cycles and replace the bit field while outputting the data burst with the replaced bit field(s) in the same number of clock cycles (e.g., the first number of clock cycles). In some cases, this may also be referred to as in-line, concurrent, parallel or simultaneous error correction. As such, the spare bit may be multiplexed with a series of data bursts into a bit stream of the code word along adding minimal or essentially no additional latency (other than the latency of the multiplexing component).

In some cases, the controller may access a memory array of the controller to determine the bit field of the set in the second portion of the code word (e.g., D1 bit of the channel 310-d within the third data burst 320-3) to be replaced by the spare bit in the first portion. The memory array may be configured to retain an indication of a spare bit assignment to a bit field of the set of the code word and may include SRAM cells. In some cases, the controller may perform an error control operation for the code word based on replacing the bit field of the set in the second portion of the code word with the spare bit.

In some cases, replacing the bit field of the set in the second portion of the code word with the spare bit may include replacing the bit field of the set with the spare bit using different methods, which may include using a combination of tiered logic gates configured based on the plurality of channels (e.g., eleven (11) channels, channel 310-a through 310-k), among others. In some cases, the combination of tiered logic gates may be configured based on a quantity of bit fields of the set (e.g., eight (8) bits) corresponding to a data burst of the plurality (e.g., sixteen (16) data bursts). Further, the first portion of the code word may correspond to an initial data burst of the plurality (e.g., the first data burst 320-1) and the second portion of the code word may correspond to one or more additional data bursts of the plurality that temporally follow the initial data burst of the plurality (e.g., the second data burst 320-2 through 320-16 or any portion thereof), in some cases.

In this manner, the controller may receive spare bits in the first data burst (e.g., up to 22 spare bits in the first data burst 320-1) of a code word and determine erroneous bits to be replaced based on accessing the memory array (e.g., SRAM cells retaining the indications of spare bit assignments), the controller may replace (e.g., substitute) the erroneous bits with spare bits concurrently with receiving additional data bursts (e.g., the second data burst through the sixteenth data burst or any portion thereof) or with output of the corrected data bursts. For example, when the controller determines that D1 bit of the channel 310-d within the third data burst 320-3 is a first erroneous bit based on accessing the memory array, the controller may replace the D1 bit of the channel 310-d within the third data burst 320-3 with a first spare bit (e.g., a spare bit A4 of the channel 310-a in the first data burst 320-1) concurrently with receiving additional data bursts (e.g., the fourth data burst 320-4 and on). As such, the controller may replace erroneous bits with spare bits before the controller performs an error control operation using information in the CwECC fields.

Figure 4:
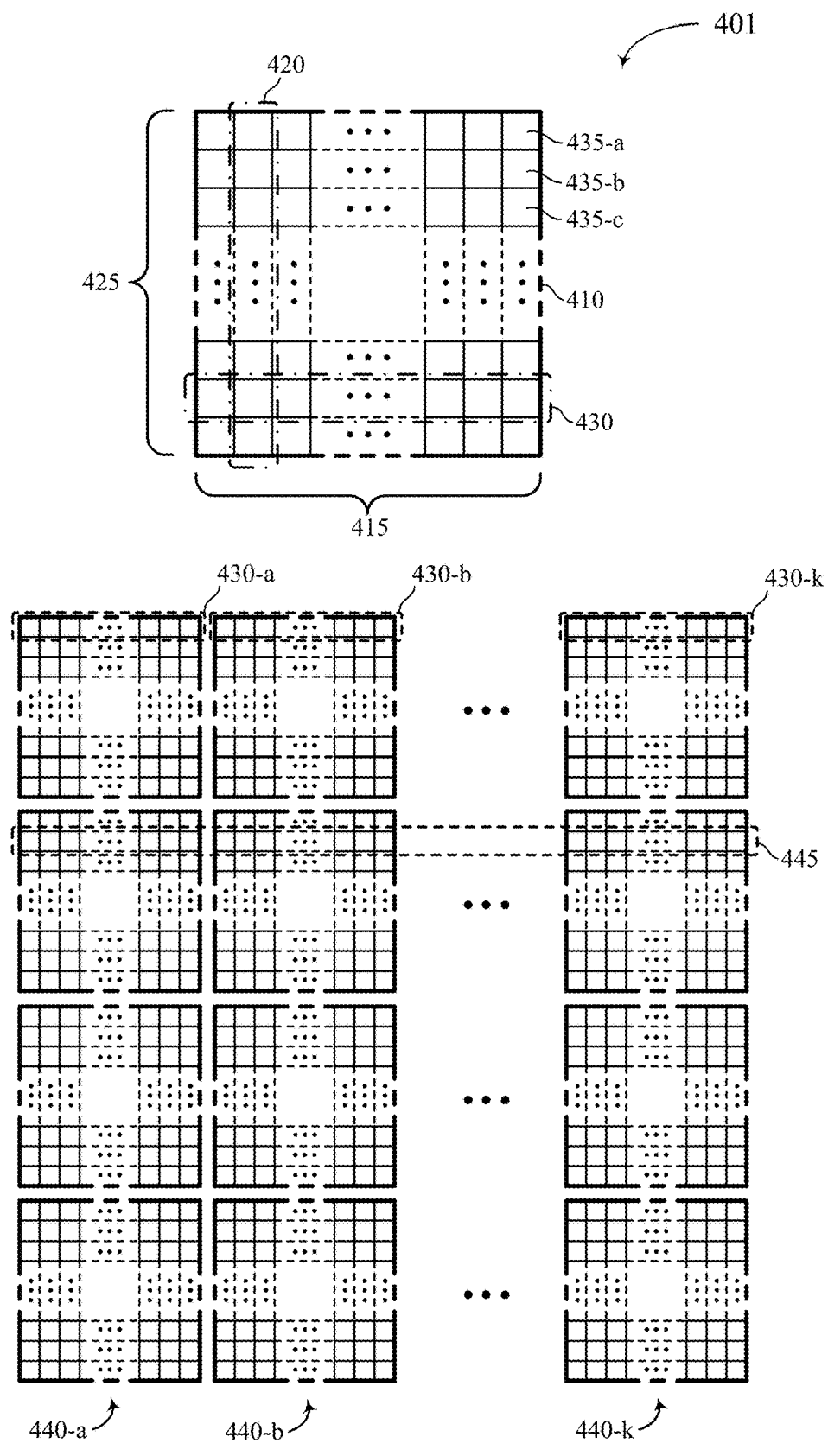
FIG. 4 illustrates examples of a configuration of a memory die and a configuration of a memory medium that support spare substitution in a memory system in accordance with aspects disclosed herein.

FIG. 4 illustrates examples of a configuration 401 of a memory array and a configuration 402 of a memory medium that support spare substitution in a memory system in accordance with aspects disclosed herein. The memory array depicted in the configuration 401 may be an example of a memory die in a memory medium (e.g., memory medium 130 or memory medium 295) described with reference to FIGS. 1 and 2. The memory medium depicted in the configuration 402 may be an example of a memory medium (e.g., memory medium 130 or memory medium 295) described with reference to FIGS. 1 and 2. The memory medium depicted in the configuration 402 may include a quantity of memory arrays (e.g., forty-four (44) memory arrays) that each may be configured according to the configuration 401.

The configuration 401 may include a memory array 410. In some cases, the memory array 410 may include a set of memory cells (e.g., 512 Giga-bits of memory cells, $2^{39}$ memory cells). The memory array 410 may be organized to have an array width 415 and an array depth 425. In some cases, the array width 415 may be referred to as a die width 415 and the array depth 425 may be referred to as a die depth 425. Further, the array width 415 and the array depth 425, each may be divided into a quantity of partitions. In some cases, the array width 415 may be divided into 128 sections. Hence, a section 420 depicted in the configuration 401 may represent one of 128 sections in the array width 415. Further, each section (e.g., the section 420) may be divided into 128 pieces such that the array depth 425 may be divided into 128 sticks. A stick may be referred to as a section, subsection, part, element, etc. Hence, a stick 430 depicted in the configuration 401 may represent one of 128 sticks in the array depth 425.

As such, the memory array 410 (e.g., 512 Giga-bits of memory cells) may be divided into a quantity of segments 435 (e.g., a segment 435-a, 435-b, or 435-c) that are each depicted as a box inside of the memory array 410 as one example. The memory array 410 may include 16,384 segments as a result of dividing the array width 415 into 128 sections that each are further divided into 128 sticks (e.g., sections, subsections, parts, elements) in the array depth 425, in this example. Each segment 435 of the memory array 410 may be referred to as an MSR 435. In some cases, an MSR 435 may include a group of memory cells (e.g., $2^{25}$ memory cells) that may be configured as a unit of data associated with an error control operation. An MSR may be configured as a reasonable fault containment zone to efficiently manage (e.g., replace, substitute) erroneous bits in the memory array.

A quantity of sections (e.g., 128 sections) in the array width 415 may be determined based on a manner of constructing a memory array in a memory die. For example, a memory array may have a quantity of tiles (e.g., 128 tiles) and the quantity of sections in the array width 415 may be based on the quantity of tiles of the memory array 410. Similarly, a quantity of sticks (e.g., 128 sticks) in the array depth 425 may be determined based on common features associated with various functional components, such as row decoders, column decoder, among others. As a result of dividing the memory array 410 as depicted in the configuration 401, each segment 435 (e.g., an MSR including $2^{25}$ memory cells out of 16,384 MSRs in a memory array including 512 Giga-bits) may provide a group of memory cells (e.g., a unit of data) to efficiently manage (e.g., replace, substitute) erroneous bits in the memory array 410 without incurring a significant overhead. In some cases, a size of the unit of memory cells (e.g., $2^{25}$ memory cells of an MSR) may be referred to as a granularity of data to support efficient error control operations associated with a memory medium.

Still referring to the configuration 401, a stick 430 across a quantity of sections (e.g., 128 sections) may represent a first quantity of bits (e.g., 128 bits) produced by the memory array 410 as part of a code word (e.g., part of a code word including 1,408 bits). The first quantity of bits (e.g., 128 bits) of the stick 430 may be further multiplexed down to a set of a second quantity of bits (e.g., eight (8) bits), where each set of the second quantity of bits (e.g., eight (8) bits) may be produced at a given data burst (e.g., one of sixteen (16) data bursts that produce a total of 128 bits). As such, the stick 430 may produce a part of a code word, in which each segment 435 (e.g., MSR 435) contributes one bit of the first quantity of bits (e.g., 128 bits) of the code word. Further, the stick 430 (e.g., 128 bits produced over 16 data bursts) may correspond to a channel (e.g., channel 291-*a* described with reference to FIG. 2). A complete code word (e.g., a code word of 1,408 bits) may be produced when a quantity of memory arrays 410 (e.g., eleven (11) memory arrays 410) operate in parallel such that each memory arrays may produce part of bits constituting the complete code word—e.g., each memory array 410 producing 128 bits over sixteen (16) data bursts across eleven (11) channels amounting to a total of 1,408 bits of a code word.

The configuration 402 may include a set of memory arrays 410 (e.g., forty-four (44) memory arrays 410) to achieve a desirable or specified capacity of a memory medium (e.g., a memory medium 130 or a memory medium 295 described with reference to FIGS. 1 and 2). The set of memory arrays in the memory medium may be arranged to form a plurality of channels for the memory medium. In some cases, the memory medium may include eleven (11) channels (e.g., channels 440-*a* through 440-*k*) as illustrated in the configuration 402. Each channel 440 may be an example or include aspects of the channel 291 (e.g., channels 291-*a* through 291-*k*) described with reference to FIG. 2. Further, each channel 440 may be configured to include a subset of the memory arrays. In some cases, a channel (e.g., channel 440-*a*) may include four (4) memory arrays 410-*a* through 410-*d*. As such, each channel of the plurality may, in some cases, include a total quantity of sticks 430 (e.g., 512 sticks) that correspond to a multiple of a quantity of sticks of a memory array 410 (e.g., 128 sticks) times a quantity of memory arrays 410 (e.g., four (4) memory arrays) within the channel.

In some cases, a group of MSRs across a plurality of channels (e.g., eleven (11) channels, i.e., channels 440-*a* through 440-*k*) that produces a code word may be referred to as an MSR strip (e.g., an MSR strip 445 depicted in the configuration 402). An MSR strip may also be referred to as an MSR region. For example, the memory medium of the configuration 402 includes 512 MSR strips (e.g., 512 MSR regions). Also, an MSR strip (e.g., an MSR strip 445) may correspond to a collective array depth (e.g., a collective die depth) of a memory medium—e.g., an MSR strip 445 depicted in the configuration 402 may correspond to the 130th array depth (e.g., the 130th MSR strip out of a total array depth of 512 MSR strips) of the memory medium, in which each memory array 410 includes 128 MSR strips. In some cases, a flag may be associated with an MSR strip (or an MSR region) to indicate a change in spare bit assignments associated with a code word retained in the MSR strip (e.g., MSR strip 345 or the MSR region 345). The flag may be part of the memory array (e.g., SRAM memory cells) in a controller (e.g., a controller 120 or a port manager 260-*a* described with reference to FIGS. 1 and 2).

At least some, if not each, MSRs (e.g., MSR 435-*a*, MSR 435-*b*, MSR 435-*c*) of a memory array (e.g., memory array 410) may be associated with a counter configured to count a quantity of erroneous bits therein. For example, a port manager (e.g., a port manager 260-*a* described with reference to FIG. 2) may, as part of a background operation, read a code word from an MSR strip (e.g., the MSR strip 445) and perform an error control operation for the code word. The port manager may identify a quantity of erroneous bits and correct the quantity of erroneous bits in the code word using a set of bits in the code word (e.g., bits supporting an error correction function). Each erroneous bit of the quantity (e.g., a faulty or unreliable memory cell) may correspond to a respective MSR of the MSR strip. The port manager may update a first counter associated with the first MSR of the MSR strip to count a quantity of erroneous bits (e.g., erroneous bit counts) in the first MSR of the MSR strip.

The port manager may sort values (e.g., erroneous bit counts) saved in the counters for a code word (e.g., 1,408 counters that each correspond to 1,408 MSRs) to identify a subset of the values that is greater than remaining values. For example, the port manager may sort the values (e.g., erroneous bit counts) in descending order to identify a subset of the values (e.g., 160 highest erroneous bit counts out of 1,408 erroneous bits counts associated with a code word). In this manner, the port manager may identify a subset of MSRs that each include higher quantities of erroneous bits compared to other MSRs. The port manager may identify the subset of MSRs (e.g., 160 MSRs out of 1,408 MSRs) as candidates for a replacement (e.g., substituting such MSRs with MSRs that are reliable, e.g., spare MSRs). In some cases, the port manager may configure a quantity of values of the subset (e.g., 200 highest erroneous bit counts instead of 160 highest erroneous bit counts) based on a quantity of erroneous bits identified in a code word. Such a quantity of values of the subset (e.g., a subset of MSRs identified as candidates for replacement) may be based on various factors (e.g., a memory technology used to fabricate a memory device of a memory medium, a maturity of such memory technology, a memory medium usage pattern) in some cases.

Further, the port manager may replace one or more MSRs (e.g., a subset of MSRs identified as candidates for replacement) having higher erroneous bit counts with a set of spare MSRs until the set of spare MSRs is exhausted. The port manager may determine to replace an MSR based on a quantity of erroneous bits (e.g., erroneous bit counts) in the MSR relative to a threshold (e.g., a bit-level replacement threshold). In some cases, the port manager may determine to replace an MSR having erroneous bit counts equal to or greater than the threshold with a spare MSR. The threshold may be based on a raw bit error rate (RBER) associated with a memory medium. In some cases, the threshold may be based on a size of an MSR (e.g., $2^{25}$ bits in an MSR). In some cases, the threshold may be configurable (e.g., programmable) to account for a maturity of technology used for fabricating memory cells of a memory medium, process variations that may affect electrical characteristics of memory cells of a memory medium, for example.

The port manager may assign a spare MSR (e.g., a spare bit in a code word) to replace any one of the MSRs identified as candidates for replacement (e.g., an erroneous bit in a code word). In some cases, spare bits (e.g., spare MSRs) may be assigned on a first recognized, first assigned basis. For example, the port manager may, during one or more background operations (e.g., a media scrubber operation), determine that a bit (e.g., A7 in channel 310-a in the sixth data burst 320-6 described with reference to FIG. 3) is a first bit in a code word to meet the threshold (e.g., first MSR including a quantity of erroneous bits that is equal to or greater than the bit-level replacement threshold). Then, an available spare bit (e.g., an MSR that corresponds to a first spare bit, e.g., a spare bit A4 of the channel 310-a in the first data burst 320-1) may be assigned to replace the first bit (e.g., A7 in channel 310-a in the sixth data burst 320-6).

Later (e.g., during a later media scrubber operation), the port manager may determine that another bit (e.g., B0 in channel 310-b in the third data burst 320-3 described with reference to FIG. 3) is a second bit in the code word to meet the threshold (e.g., second MSR including a quantity of erroneous bits that is equal to or greater than the bit-level replacement threshold). Then, a second available spare bit (e.g., another MSR that corresponds to a second spare bit, e.g., a spare bit A3 of the channel 310-a in the first data burst 320-1) may be assigned to replace the second bit (e.g., B0 in channel 310-b in the third data burst 320-3).

The port manager may repeat assigning spare bits to erroneous bits in a code word until all the spare bits (e.g., up to twenty-two (22) spare bits as described with reference to FIG. 3) are assigned. In some cases, a spare bit (e.g., a spare MSR) may be re-assigned to a different erroneous bit (e.g., a different MSR including a quantity of erroneous bits that is equal to or greater than the bit-level threshold). In other cases, each spare bit may remain assigned to a respective erroneous bit in a code word once the spare bit has been assigned to the respective erroneous bit. When a set of erroneous bits (e.g., a set of MSRs corresponding to the set of erroneous bits) to replace is greater than available spare bits (e.g., MSRs corresponding to the available spare bits), the port manager may assign the available spare bits to a subset of erroneous bits, where the subset of MSRs corresponding to the subset of erroneous bits each include a greater erroneous bit counts therein compared to other MSRs. As such, the port manager may replace the most problematic MSRs (e.g., based on erroneous bit counts in an MSR) with the available spare bits.

The port manager may save information indicative of a spare assignment (e.g., spare bit assignments to respective erroneous bits) of a code word in a separate memory array. In some cases, the memory array may be integrated as part of the port manager. In some cases, the memory array may include a static random access memory (SRAM) cells. A size of the memory array allocated for saving the information may be based on an identification of a channel of the plurality (e.g., eleven (11) channels), a quantity of spare bits in the code word (e.g., up to twenty-two (22) spare bits), an identification of one or more MSR of a quantity of MSRs associated with the code word (e.g., 1,408 MSRs), a quantity of bits associated with forwarded code words in the memory medium, an error correction capability for an indication of a spare bit assignment, a quantity of memory dice corresponding to a channel of the plurality (e.g., four (4) memory dice per a channel), a quantity of MSR groups in a memory die of the quantity (e.g., 128 MSR sticks), or a bit indicating a change in a spare bit assignment (e.g., a flag indicating a change in spare assignments), or any combination thereof.

In some cases, the port manager may receive an indication of a power level from a power management component coupled with the port manager and transfer the information (e.g., an indication of the spare bit assignment) saved in the memory array (e.g., SRAM cells) to a non-volatile memory (e.g., a persistent memory) as described with reference to FIGS. 1 and 2.

In some cases, the port manager may set a flag associated with a port manager based on assigning a spare bit of a code word to replace an erroneous bit in the code word. The flag may indicate a change in spare bit assignments (e.g., a spare bit assigned to a new erroneous bit of a code word during a media scrubber operation) associated with a code word retained in a group of MSRs (e.g., an MSR region 345 or an MSR strip 345) that includes the respective MSRs of the code word. The flag may be part of the memory array (e.g., SRAM memory cells) in the port manager.

In some cases, a code word may be configured to support a channel substitution. A channel substitution may refer to replacing a stick (e.g., stick 430-a or stick 430-b) with another stick (e.g., stick 430-k) within a code word. A stick may be referred to as a section, subsection, part, element, etc. Hence, a channel substitution may refer to a replacement in the die width 415, not a replacement in the die depth 425. Further, one of channels 440-a through 440-j in a code word may be substituted with a channel 440-k in the code word when one of the channels includes a quantity of erroneous bits (e.g., a quantity of MSRs corresponding to the quantity of erroneous bits) that each meet a first threshold (e.g., a bit-level replacement threshold). If there are more than one such channels in a code word, the port manager may determine to substitute a worst channel (e.g., a channel including the greatest number of erroneous bits meeting the bit-level replacement threshold).

In some cases, a controller (e.g., a controller 120 or a port manager 260-a described with reference to FIGS. 1 and 2) may read a code word from a memory medium (e.g., a memory medium 130-a or a memory medium 295-a) that includes a plurality of MSRs. The code word may include a set of bit fields indicative of a plurality of channels (e.g., channels 291-a through 291-k, channels 310-a through 310-k, or channels 440-a through 440-k as described with reference to FIGS. 2 through 4) associated with the memory medium.

At least some, if not each, bit fields of the set may correspond to a respective MSR of the plurality that may be associated with a counter. The controller may identify, based on reading the code word, a first quantity of counters associated with a channel of the plurality (e.g., one of channels 310-a through 310-j or one of channels 440-a through 440-j described with reference to FIGS. 3 and 4), where the first quantity of counters may each have a value equal to or greater than a first threshold (e.g., a bit-level substitution threshold). The controller may determine that the first quantity is equal to or greater than a second threshold (e.g., a channel-level substitution threshold). In some cases, the controller may assign a spare channel of the code word (e.g., channel 310-k or channel 440-k described with reference to FIGS. 3 and 4) to the channel of the plurality based on determining that the first quantity (e.g., a quantity of bit fields meeting the bit-level substitution threshold) is equal to or greater than the second threshold (e.g., the channel-level substitution threshold).

In some cases, the controller may identify a quantity of erroneous bits using an error control operation that may be based on a size of one or more MSRs of the plurality and set (e.g., initially set, update) values of counters associated with respective MSRs that each correspond to an erroneous bit of the quantity such that the first quantity of counters associated with the channel of the plurality may be identified based on setting (e.g., initially setting, updating) the values of the counters. In some cases, the controller may write an indication of the spare channel assignment with respect to the channel of the plurality to a memory array (e.g., SRAM cells) of the controller based on assigning the spare channel of the code word. In some cases, the controller may set a flag associated with the controller based on assigning the spare channel of the code word. The flag may indicate a change in a spare channel assignment associated a code word retained in the memory medium. In some cases, the first threshold (e.g., a bit-level replacement threshold) may correspond to a configurable (e.g., programmable) value associated with assigning a spare bit of the code word to a bit field of the set. In some cases, the second threshold (e.g., a channel-level replacement threshold) may correspond to a second quantity of bit fields within a channel of the plurality, each bit field of the second quantity associated with a respective counter having a value equal to or greater than the first threshold (e.g., the bit-level substitution threshold).

The controller may, in some cases, perform one or more background operations for a set of code words retained in a memory medium independent of an access operation from a host—e.g., reading a code word, identifying a quantity of erroneous bits in the code word, updating counters associated with respective MSRs corresponding to the quantity of erroneous bits in the code word, determining the value of the counter relative to a threshold (e.g., a bit-level substitution threshold), assigning a spare bit of the code word to the erroneous bit, writing an indication of the spare bit assignment to a memory array (e.g., SRAM cells), or setting flags to indicate a spare assignment change in an MSR strip upon assigning a new spare bit within the MSR strip, or any combination thereof.

The set of code word may include at least some, if not all, the code words retained in a memory medium and the controller may perform the background operation one code word at a time (e.g., serially) for the entire code words. In some cases, the set of code word may include all the code words retained in a group of the MSRs (e.g., MSR strip 345 or MSR region 345) that includes the respective MSRs of the code word. Further, the controller may repeat the background operations for the all the code words retained in the memory medium (or the group of the MSRs), which may include periodically performing the background operations for one or more code words in the memory medium (or the group of the MSRs). The background operation may be referred to as a media scrubber operation (which may also be referred to as a media scrubbing function), in some cases.

Figure 5:
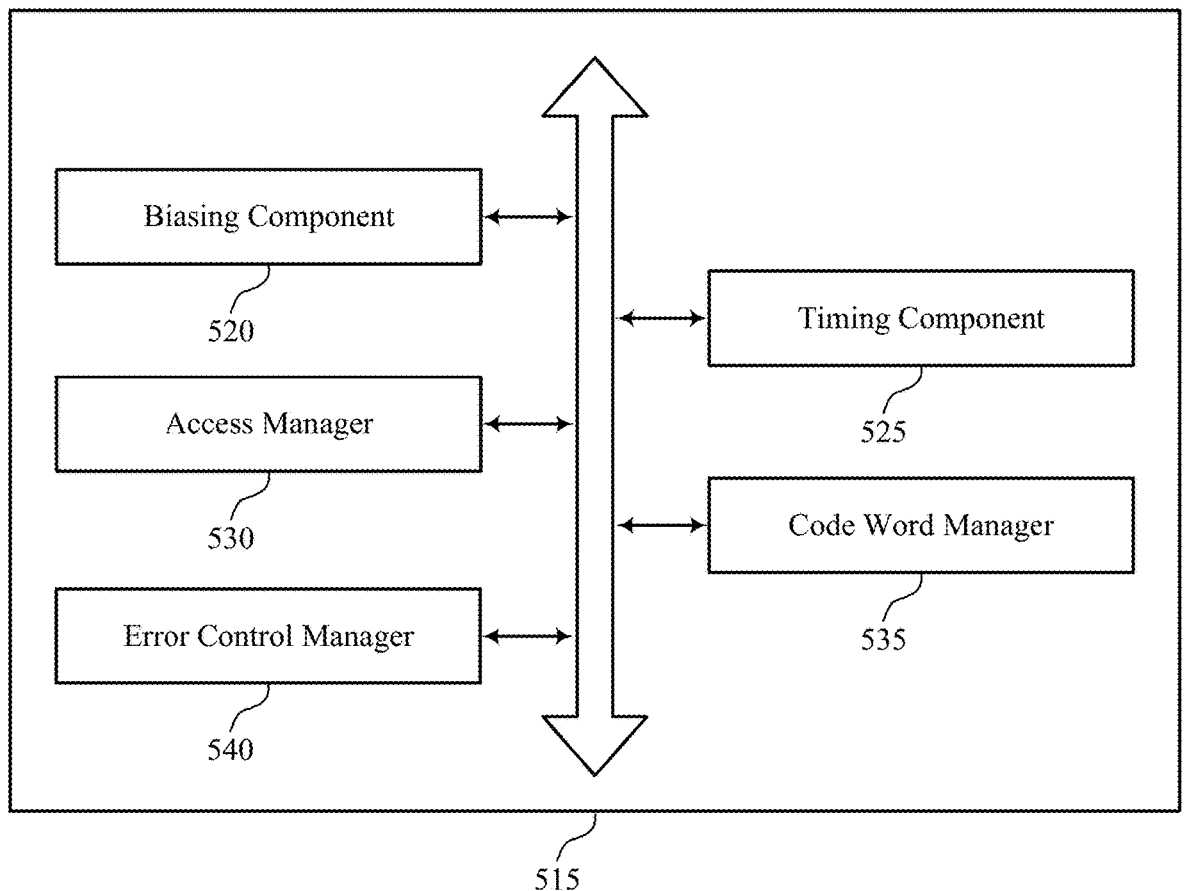
FIG. 5 shows a block diagram of a device that supports spare substitution in a memory system in accordance with aspects disclosed herein

FIG. 5 shows a block diagram 500 of a controller 515 that supports spare substitution in a memory system in accordance with aspects disclosed herein. The controller 515 may be an example of aspects of the controller 120 or the controller 230 described with reference to FIGS. 1 through 2. The controller 515 may include a biasing component 520, a timing component 525, an access manager 530, a code word manager 535, and an error control manager 540. Each of these modules may communicate, directly or indirectly, with one another (e.g., via one or more buses).

The access manager 530 may receive a first portion of a code word from a memory medium, the code word including a set of bit fields indicative of a plurality of data bursts across a plurality of channels. In some cases, the access manager 530 may receive a second portion of the code word based on determining a bit field of the set to be replaced by a spare bit.

In some cases, the access manager 530 may read a code word from a memory medium that includes a set of Minimum Substitution Regions (MSRs), the code word including a plurality of bits that each correspond to a respective MSR of the set. In some cases, the access manager 530 may retrieve the code word as part of a background operation independent of an access command from a host, where identifying the quantity of erroneous bits may be based on retrieving the code word. In some cases, the access manager 530 may retrieve a plurality of code words from a subset of the MSRs that includes the respective MSRs by retrieving each code word serially, where identifying the quantity of erroneous bits is based on serially retrieving each code word.

In some cases, the access manager 530 may read a code word from a memory medium that includes a plurality of Minimum Substitution Regions (MSRs), the code word including a set of bit fields indicative of a plurality of channels associated with the memory medium, where each bit field of the set may correspond to a respective MSR of the plurality that is associated with a counter.

The code word manager 535 may identify a spare bit in the first portion of the code word to replace a bit field of the set based on receiving the first portion of the code word. In some cases, the first portion of the code word may correspond to an initial data burst of the plurality and the second portion of the code word may correspond to one or more additional data bursts of the plurality that temporally follow the initial data burst of the plurality.

The error control manager 540 may determine, based on identifying the spare bit, the bit field of the set to be replaced by the spare bit. In some cases, the error control manager 540 may replace the bit field of the set in the second portion of the code word with the spare bit concurrently with receiving the second portion of the code word. In some cases, the error control manager 540 may perform an error control operation for the code word based on replacing the bit field of the set in the second portion of the code word with the spare bit. In some cases, the error control manager 540 may access a memory array of a port manager, the memory array configured to retain an indication of a spare bit assignment to a bit field of the set of the code word, where the bit field of the set in the second portion of the code word determined to be replaced by the spare bit may be based on accessing the memory array.

In some cases, a size of the memory array for retaining the indication of the spare bit assignment may be based on an identification of a channel of the plurality, a quantity of spare bits in the code word, an identification of a Minimum Substitution Region (MSR) of a quantity of MSRs associated with the code word, a quantity of bits associated with forwarded code words in the memory medium, an error correction capability for an indication of a spare bit assignment, a quantity of memory dice corresponding to a channel of the plurality, a quantity of MSR groups in a memory die of the quantity, or a bit indicating a change in a spare bit assignment, or any combination thereof.

In some cases, replacing the bit field of the set in the second portion of the code word with the spare bit may further include replacing, based on receiving the second portion of the code word, the bit field of the set with the spare bit using a combination of tiered logic gates configured based on the plurality of channels. In some cases, replacing the bit field of the set in the second portion of the code word with the spare bit may further include replacing, based on receiving the second portion of the code word, the bit field of the set with the spare bit using a combination of tiered logic gates configured based on a quantity of bit fields of the set corresponding to a data burst of the plurality.

In some cases, the error control manager 540 may identify a quantity of erroneous bits in the code word using an error control operation that may be based on a size of one or more MSRs of the set. In some cases, the error control manager 540 may set a value of a counter associated with an MSR of the set based on identifying the quantity of erroneous bits in the code word, the MSR of the set corresponding to an erroneous bit of the quantity. In some cases, the error control manager 540 may determine the value of the counter relative to a threshold based on the value of the counter. In some cases, the error control manager 540 may assign a spare bit of the code word to the erroneous bit of the quantity based on the value of the counter relative to the threshold.

In some cases, the error control manager 540 may replace the erroneous bit of the quantity with the spare bit of the code word based on assigning the spare bit of the code word. In some cases, the error control manager 540 may write an indication of the spare bit assignment with respect to the erroneous bit of the quantity to a memory array of a port manager based on assigning the spare bit of the code word, the memory array configured to save a plurality of such indications associated with a plurality of spare bits in the code word. In some cases, the error control manager 540 may configure the threshold to a raw bit error rate (RBER) associated with the memory medium based on identifying the quantity of erroneous bits in the code word. In some cases, the error control manager 540 may configure the threshold to a size of an MSR of the set based on identifying the quantity of erroneous bits in the code word. In some cases, the error control manager 540 may set a flag associated with a port manager based on assigning the spare bit of the code word, the flag indicating a change in a spare bit assignment associated with a code word retained in a subset of the MSRs that includes the respective MSRs. In some cases, the subset of the MSRs may include a plurality of code words.

In some cases, the error control manager 540 may identify, based on reading the code word, a first quantity of counters associated with a channel of the plurality, the first quantity of counters each having a value equal to or greater than a first threshold. In some cases, the error control manager 540 may determine that the first quantity is equal to or greater than a second threshold based on identifying the first quantity of counters. In some cases, the error control manager 540 may assign a spare channel of the code word to the channel of the plurality based on determining that the first quantity is equal to or greater than the second threshold.

In some cases, the error control manager 540 may identify a quantity of erroneous bits using an error control operation that may be based on a size of one or more MSRs of the plurality. In some cases, the error control manager 540 may set, based on identifying the quantity of erroneous bits, values of counters associated with respective MSRs that each correspond to an erroneous bit of the quantity, where identifying the first quantity of counters associated with the channel of the plurality may be based on setting the values of the counters. In some cases, the error control manager 540 may write an indication of the spare channel assignment with respect to the channel of the plurality to a memory array of a port manager based on assigning the spare channel of the code word. In some cases, the error control manager 540 may set a flag associated with a port manager based on assigning the spare channel of the code word, the flag indicating a change in a spare channel assignment associated a code word retained in the memory medium.

In some cases, the first threshold may correspond to a configurable value associated with assigning a spare bit of the code word to a bit field of the set. In some cases, the second threshold may correspond to a second quantity of bit fields within a channel of the plurality, each bit field of the second quantity associated with a respective counter having a value equal to or greater than the first threshold.

Figure 6:
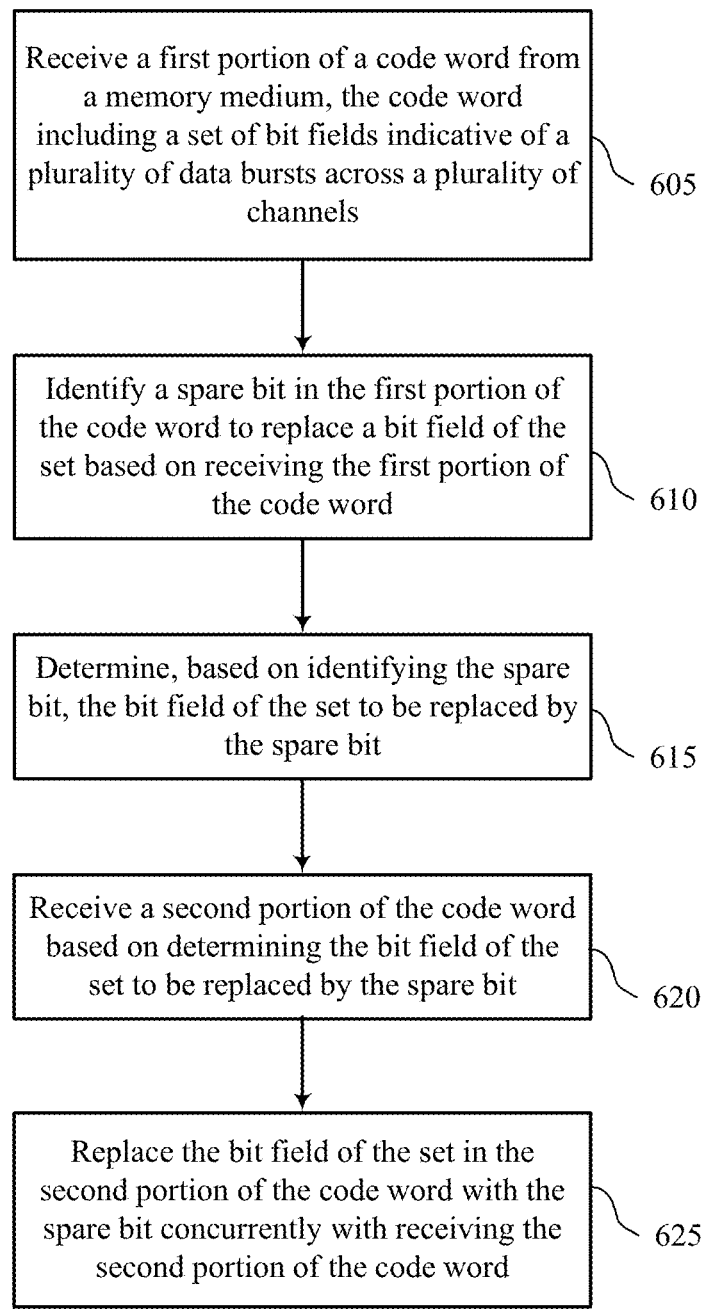
FIGS. 6 through 8 illustrate a method or methods supporting spare substitution in a memory system in accordance with aspects disclosed herein.

FIG. 6 shows a flowchart illustrating a method 600 that supports spare substitution in a memory system in accordance with aspects disclosed herein. The operations of method 600 may be implemented by a controller or its components as described with reference to FIGS. 1 through 2. For example, the operations of method 600 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 605 the controller 230 may receive a first portion of a code word from a memory medium, the code word including a set of bit fields indicative of a plurality of data bursts across a plurality of channels. The operations of 605 may be performed according to the methods described with reference to FIGS. 1-5. In certain examples, aspects of the operations of 605 may be performed by an access manager as described with reference to FIG. 5.

At 610 the controller 230 may identify a spare bit in the first portion of the code word to replace a bit field of the set based on receiving the first portion of the code word. The operations of 610 may be performed according to the methods described with reference to FIGS. 1-5. In certain examples, aspects of the operations of 610 may be performed by a code word manager as described with reference to FIG. 5.

At 615 the controller 230 may determine, based on identifying the spare bit, the bit field of the set to be replaced by the spare bit. The operations of 615 may be performed according to the methods described with reference to FIGS. 1-5. In certain examples, aspects of the operations of 615 may be performed by an error control manager as described with reference to FIG. 5.

At 620 the controller 230 may receive a second portion of the code word based on determining the bit field of the set to be replaced by the spare bit. The operations of 620 may be performed according to the methods described with reference to FIGS. 1-5. In certain examples, aspects of the operations of 620 may be performed by an access manager as described with reference to FIG. 5.

At 625 the controller 230 may replace the bit field of the set in the second portion of the code word with the spare bit concurrently with receiving the second portion of the code word. The operations of 625 may be performed according to the methods described with reference to FIGS. 1-5. In certain examples, aspects of the operations of 625 may be performed by an error control manager as described with reference to FIG. 5.

An apparatus for performing a method or methods, such as the method 600, is described. The apparatus may include means for receiving a first portion of a code word from a memory medium, the code word including a set of bit fields indicative of a plurality of data bursts across a plurality of channels, means for identifying a spare bit in the first portion of the code word to replace a bit field of the set based on receiving the first portion of the code word, means for determining, based on identifying the spare bit, the bit field of the set to be replaced by the spare bit, means for receiving a second portion of the code word based on determining the bit field of the set to be replaced by the spare bit, and means for replacing the bit field of the set in the second portion of the code word with the spare bit concurrently with receiving the second portion of the code word.

Another apparatus for performing a method or methods, such as the method 600, is described. The apparatus may include a memory medium and a controller in electronic communication with the memory medium, where the controller may be operable to receive a first portion of a code word from a memory medium, the code word including a set of bit fields indicative of a plurality of data bursts across a plurality of channels, identify a spare bit in the first portion of the code word to replace a bit field of the set based on receiving the first portion of the code word, determine, based on identifying the spare bit, the bit field of the set to be replaced by the spare bit, receive a second portion of the code word based on determining the bit field of the set to be replaced by the spare bit, and replace the bit field of the set in the second portion of the code word with the spare bit concurrently with receiving the second portion of the code word.

Some examples of the method 600 and apparatuses described herein may further include processes, features, means, or instructions for performing an error control operation for the code word based on replacing the bit field of the set in the second portion of the code word with the spare bit. Some examples of the method 600 and apparatuses described herein may further include processes, features, means, or instructions for accessing a memory array of a port manager, the memory array configured to retain an indication of a spare bit assignment to a bit field of the set of the code word, where the bit field of the set in the second portion of the code word determined to be replaced by the spare bit may be based on accessing the memory array.

In some examples of the method 600 and apparatuses described herein, a size of the memory array for retaining the indication of the spare bit assignment may be based on an identification of a channel of the plurality, a quantity of spare bits in the code word, an identification of a Minimum Substitution Region (MSR) of a quantity of MSRs associated with the code word, a quantity of bits associated with forwarded code words in the memory medium, an error correction capability for an indication of a spare bit assignment, a quantity of memory dice corresponding to a channel of the plurality, a quantity of MSR groups in a memory die of the quantity, or a bit indicating a change in a spare bit assignment, or any combination thereof.

In some examples of the method 600 and apparatuses described herein, replacing the bit field of the set in the second portion of the code word with the spare bit may further includes replacing, based on receiving the second portion of the code word, the bit field of the set with the spare bit using a combination of tiered logic gates configured based on a quantity of bit fields of the set corresponding to a data burst of the plurality. In some examples of the method 600 and apparatuses described herein, the first portion of the code word may correspond to an initial data burst of the plurality and the second portion of the code word may correspond to one or more additional data bursts of the plurality that temporally follow the initial data burst of the plurality.

Figure 7:
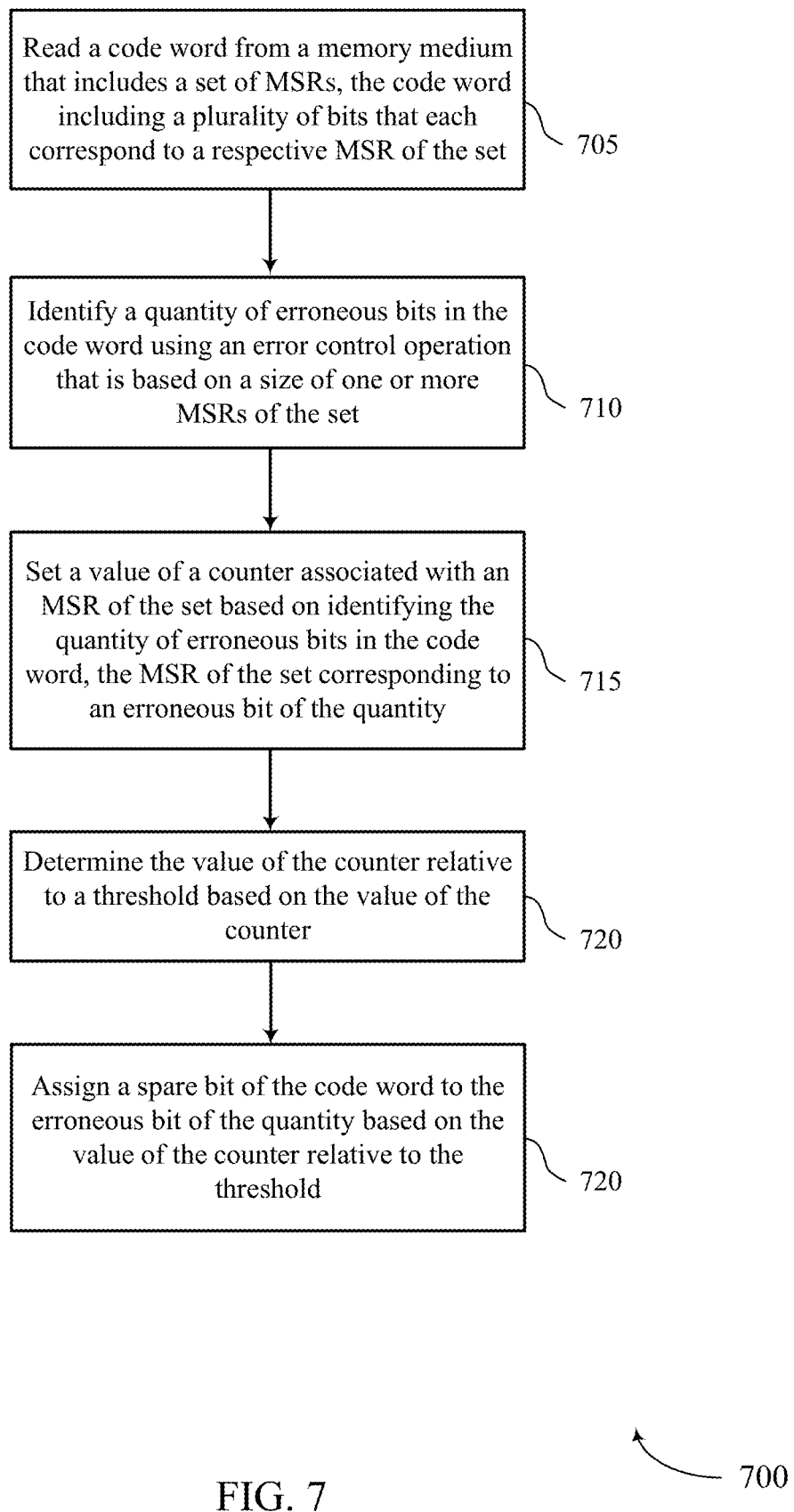

FIG. 7 shows a flowchart illustrating a method 700 that supports spare substitution in a memory system in accordance with aspects disclosed herein. The operations of method 700 may be implemented by a controller or its components as described with reference to FIGS. 1 through 2. For example, the operations of method 700 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 705 the controller 230 may read a code word from a memory medium that includes a set of Minimum Substitution Regions (MSRs), the code word including a plurality of bits that each correspond to a respective MSR of the set. The operations of 705 may be performed according to the methods described with reference to FIGS. 1-5. In certain examples, aspects of the operations of 705 may be performed by an access manager as described with reference to FIG. 5.

At 710 the controller 230 may identify a quantity of erroneous bits in the code word using an error control operation that may be based on a size of one or more MSRs of the set. The operations of 710 may be performed according to the methods described with reference to FIGS. 1-5. In certain examples, aspects of the operations of 710 may be performed by an error control manager as described with reference to FIG. 5.

At 715 the controller 230 may set a value of a counter associated with an MSR of the set based on identifying the quantity of erroneous bits in the code word, the MSR of the set corresponding to an erroneous bit of the quantity. The operations of 715 may be performed according to the methods described with reference to FIGS. 1-5. In certain examples, aspects of the operations of 715 may be performed by an error control manager as described with reference to FIG. 5.

At 720 the controller 230 may determine the value of the counter relative to a threshold based on the value of the counter. The operations of 720 may be performed according to the methods described with reference to FIGS. 1-5. In certain examples, aspects of the operations of 720 may be performed by an error control manager as described with reference to FIG. 5.

At 725 the controller 230 may assign a spare bit of the code word to the erroneous bit of the quantity based on the value of the counter relative to the threshold. The operations of 725 may be performed according to the methods described with reference to FIGS. 1-5. In certain examples, aspects of the operations of 725 may be performed by an error control manager as described with reference to FIG. 5.

An apparatus for performing a method or methods, such as the method 700, is described. The apparatus may include means for reading a code word from a memory medium that includes a set of Minimum Substitution Regions (MSRs), the code word including a plurality of bits that each correspond to a respective MSR of the set, means for identifying a quantity of erroneous bits in the code word using an error control operation that may be based on a size of one or more MSRs of the set, means for setting a value of a counter associated with an MSR of the set based on identifying the quantity of erroneous bits in the code word, the MSR of the set corresponding to an erroneous bit of the quantity, means for determining the value of the counter relative to a threshold based on the value of the counter, and means for assigning a spare bit of the code word to the erroneous bit of the quantity based on the value of the counter relative to the threshold.

Another apparatus for performing a method or methods, such as the method 700, is described. The apparatus may include a memory medium and a controller in electronic communication with the memory medium, where the controller may be operable to read a code word from a memory medium that includes a set of Minimum Substitution Regions (MSRs), the code word including a plurality of bits that each correspond to a respective MSR of the set, identify a quantity of erroneous bits in the code word using an error control operation that may be based on a size of one or more MSRs of the set, set a value of a counter associated with an MSR of the set based on identifying the quantity of erroneous bits in the code word, the MSR of the set corresponding to an erroneous bit of the quantity, determine the value of the counter relative to a threshold based on the value of the counter, and assign a spare bit of the code word to the erroneous bit of the quantity based on the value of the counter relative to the threshold.

Some examples of the method 700 and apparatuses described herein may further include processes, features, means, or instructions for replacing the erroneous bit of the quantity with the spare bit of the code word based on assigning the spare bit of the code word. Some examples of the method 700 and apparatuses described herein may further include processes, features, means, or instructions for writing an indication of the spare bit assignment with respect to the erroneous bit of the quantity to a memory array of a port manager based on assigning the spare bit of the code word, the memory array configured to save a plurality of such indications associated with a plurality of spare bits in the code word. Some examples of the method 700 and apparatuses described herein may further include processes, features, means, or instructions for configuring the threshold to a raw bit error rate (RBER) associated with the memory medium based on identifying the quantity of erroneous bits in the code word.

Some examples of the method 700 and apparatuses described herein may further include processes, features, means, or instructions for configuring the threshold to a size of an MSR of the set based on identifying the quantity of erroneous bits in the code word. Some examples of the method 700 and apparatuses described herein may further include processes, features, means, or instructions for setting a flag associated with a port manager based on assigning the spare bit of the code word, the flag indicating a change in a spare bit assignment associated with a code word retained in a subset of the MSRs that includes the respective MSRs. In some examples of the method 700 and apparatuses described herein, the subset of the MSRs may include a plurality of code words.

In some examples of the method 700 and apparatuses described herein, reading the code word from the memory medium may further include retrieving the code word as part of a background operation independent of an access command from a host, where identifying the quantity of erroneous bits may be based on retrieving the code word. In some examples of the method 700 and apparatuses described herein, reading the code word from the memory medium may further include retrieving a plurality of code words from a subset of the MSRs that includes the respective MSRs by retrieving each code word serially, where identifying the quantity of erroneous bits may be based on serially retrieving each code word.

Figure 8:
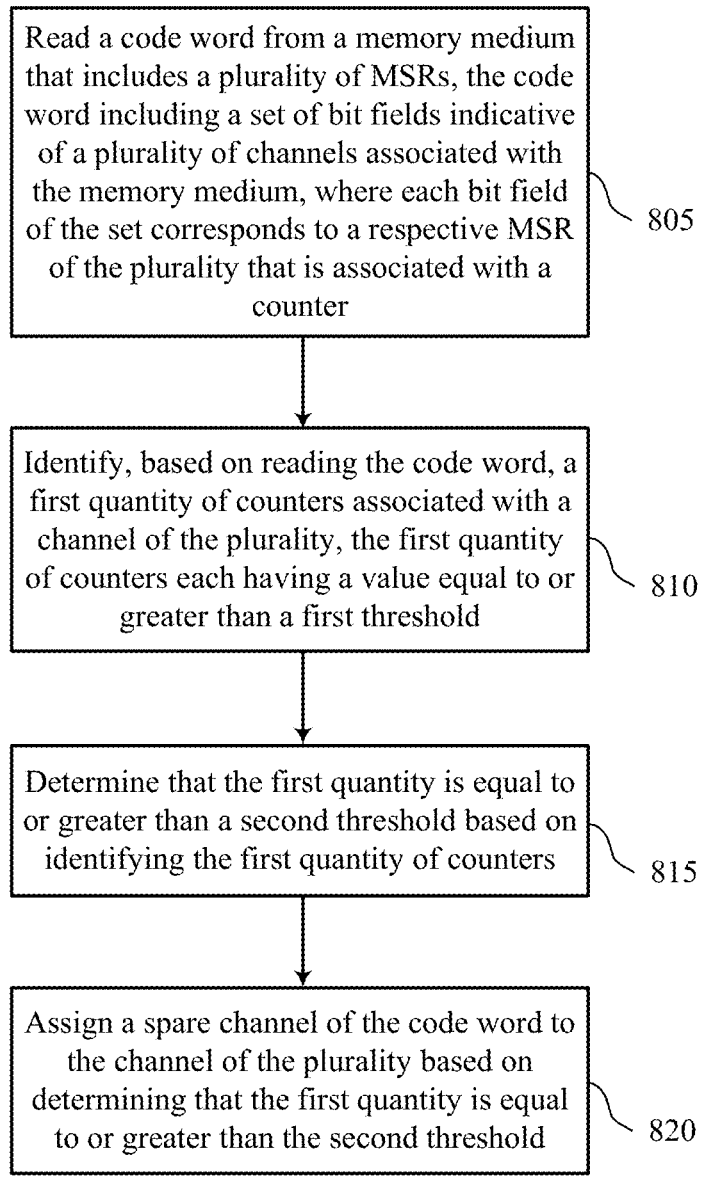

FIG. 8 shows a flowchart illustrating a method 800 that supports spare substitution in a memory system in accordance with aspects disclosed herein. The operations of method 800 may be implemented by a controller or its components as described with reference to FIGS. 1 through 2. For example, the operations of method 800 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 805 the controller 230 may read a code word from a memory medium that includes a plurality of Minimum Substitution Regions (MSRs), the code word including a set of bit fields indicative of a plurality of channels associated with the memory medium, where each bit field of the set may correspond to a respective MSR of the plurality that is associated with a counter. The operations of 805 may be performed according to the methods described with reference to FIGS. 1-5. In certain examples, aspects of the operations of 805 may be performed by an access manager as described with reference to FIG. 5.

At 810 the controller 230 may identify, based on reading the code word, a first quantity of counters associated with a channel of the plurality, the first quantity of counters each having a value equal to or greater than a first threshold. The operations of 810 may be performed according to the methods described with reference to FIGS. 1-5. In certain examples, aspects of the operations of 810 may be performed by an error control manager as described with reference to FIG. 5.

At 815 the controller 230 may determine that the first quantity is equal to or greater than a second threshold based on identifying the first quantity of counters. The operations of 815 may be performed according to the methods described with reference to FIGS. 1-5. In certain examples, aspects of the operations of 815 may be performed by an error control manager as described with reference to FIG. 5.

At 820 the controller 230 may assign a spare channel of the code word to the channel of the plurality based on determining that the first quantity is equal to or greater than the second threshold. The operations of 820 may be performed according to the methods described with reference to FIGS. 1-5. In certain examples, aspects of the operations of 820 may be performed by an error control manager as described with reference to FIG. 5.

An apparatus for performing a method or methods, such as the method 800, is described. The apparatus may include means for reading a code word from a memory medium that includes a plurality of Minimum Substitution Regions (MSRs), the code word including a set of bit fields indicative of a plurality of channels associated with the memory medium, where each bit field of the set may correspond to a respective MSR of the plurality that is associated with a counter, means for identifying, based on reading the code word, a first quantity of counters associated with a channel of the plurality, the first quantity of counters each having a value equal to or greater than a first threshold, means for determining that the first quantity is equal to or greater than a second threshold based on identifying the first quantity of counters, and means for assigning a spare channel of the code word to the channel of the plurality based on determining that the first quantity is equal to or greater than the second threshold.

Another apparatus for performing a method or methods, such as the method 800, is described. The apparatus may include a memory medium and a controller in electronic communication with the memory medium, where the controller may be operable to read a code word from a memory medium that includes a plurality of Minimum Substitution Regions (MSRs), the code word including a set of bit fields indicative of a plurality of channels associated with the memory medium, where each bit field of the set may correspond to a respective MSR of the plurality that is associated with a counter, identify, based on reading the code word, a first quantity of counters associated with a channel of the plurality, the first quantity of counters each having a value equal to or greater than a first threshold, determine that the first quantity is equal to or greater than a second threshold based on identifying the first quantity of counters, and assign a spare channel of the code word to the channel of the plurality based on determining that the first quantity is equal to or greater than the second threshold.

Some examples of the method 800 and apparatuses described herein may further include processes, features, means, or instructions for identifying a quantity of erroneous bits using an error control operation that may be based on a size of one or more MSRs of the plurality. Some examples of the method 800 and apparatuses described herein may further include processes, features, means, or instructions for setting, based on identifying the quantity of erroneous bits, values of counters associated with respective MSRs that each correspond to an erroneous bit of the quantity, where identifying the first quantity of counters associated with the channel of the plurality may be based on setting the values of the counters.

Some examples of the method 800 and apparatuses described herein may further include processes, features, means, or instructions for writing an indication of the spare channel assignment with respect to the channel of the plurality to a memory array of a port manager based on assigning the spare channel of the code word. Some examples of the method 800 and apparatuses described herein may further include processes, features, means, or instructions for setting a flag associated with a port manager based on assigning the spare channel of the code word, the flag indicating a change in a spare channel assignment associated a code word retained in the memory medium.

In some examples of the method 800 and apparatuses described herein, the first threshold may correspond to a configurable value associated with assigning a spare bit of the code word to a bit field of the set. In some examples of the method 800 and apparatuses described herein, the second threshold may correspond to a second quantity of bit fields within a channel of the plurality, each bit field of the second quantity associated with a respective counter having a value equal to or greater than the first threshold.

It should be noted that the methods described herein describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory media 130, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the herein description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
reading a code word from a memory medium that comprises a set of Minimum Substitution Regions (MSRs), the code word comprising a plurality of bits that each correspond to a respective MSR of the set;
identifying a quantity of erroneous bits in the code word using an error control operation that is based at least in part on a size of one or more MSRs of the set;
setting a value of a counter associated with an MSR of the set based at least in part on identifying the quantity of erroneous bits in the code word, the MSR of the set corresponding to an erroneous bit of the quantity;

determining the value of the counter relative to a threshold based at least in part on the value of the counter; and assigning a spare bit of the code word to the erroneous bit of the quantity based at least in part on the value of the counter relative to the threshold.

2. The method of claim 1, further comprising:

replacing the erroneous bit of the quantity with the spare bit of the code word based at least in part on assigning the spare bit of the code word.

3. The method of claim 1, further comprising:

writing an indication of the spare bit assignment with respect to the erroneous bit of the quantity to a memory array of a port manager based at least in part on assigning the spare bit of the code word, the memory array configured to save a plurality of such indications associated with a plurality of spare bits in the code word.

4. The method of claim 1, further comprising:

configuring the threshold to a raw bit error rate (RBER) associated with the memory medium based at least in part on identifying the quantity of erroneous bits in the code word.

5. The method of claim 1, further comprising:

configuring the threshold to a size of an MSR of the set based at least in part on identifying the quantity of erroneous bits in the code word.

6. The method of claim 1, further comprising:

setting a flag associated with a port manager based at least in part on assigning the spare bit of the code word, the flag indicating a change in a spare bit assignment associated with the code word retained in a subset of the MSRs that comprises the respective MSRs.

7. The method of claim 6, wherein the subset of the MSRs comprises a plurality of code words.

8. The method of claim 1, wherein reading the code word from the memory medium further comprises:

retrieving the code word as part of a background operation independent of an access command from a host, wherein identifying the quantity of erroneous bits is based at least in part on retrieving the code word.

9. The method of claim 1, wherein reading the code word from the memory medium further comprises:

retrieving a plurality of code words from a subset of the MSRs that comprises the respective MSRs by retrieving each code word serially, wherein identifying the quantity of erroneous bits is based at least in part on serially retrieving each code word.

10. An apparatus, comprising:

a processor; and memory comprising instructions which, when executed by the processor, cause the apparatus to:

read a code word from a memory medium that comprises a set of Minimum Substitution Regions (MSRs), the code word comprising a plurality of bits that each correspond to a respective MSR of the set;

identify a quantity of erroneous bits in the code word using an error control operation that is based at least in part on a size of one or more MSRs of the set;

set a value of a counter associated with an MSR of the set based at least in part on identifying the quantity of erroneous bits in the code word, the MSR of the set corresponding to an erroneous bit of the quantity;

determine the value of the counter relative to a threshold based at least in part on the value of the counter; and assign a spare bit of the code word to the erroneous bit of the quantity based at least in part on the value of the counter relative to the threshold.

11. The apparatus of claim 10, wherein the instructions, when executed by the processor, further cause the apparatus to:

replace the erroneous bit of the quantity with the spare bit of the code word based at least in part on assigning the spare bit of the code word.

12. The apparatus of claim 10, the instructions, when executed by the processor, further cause the apparatus to:

write an indication of the spare bit assignment with respect to the erroneous bit of the quantity to a memory array of a port manager based at least in part on assigning the spare bit of the code word, the memory array configured to save a plurality of such indications associated with a plurality of spare bits in the code word.

13. The apparatus of claim 10, wherein the instructions, when executed by the processor, further cause the apparatus to configure the threshold to a raw bit error rate (RBER) associated with the memory medium based at least in part on identifying the quantity of erroneous bits in the code word.

14. The apparatus of claim 10, wherein the instructions, when executed by the processor, further cause the apparatus to:

configure the threshold to a size of an MSR of the set based at least in part on identifying the quantity of erroneous bits in the code word.

15. The apparatus of claim 10, wherein the instructions, when executed by the processor, further cause the apparatus to:

set a flag associated with a port manager based at least in part on assigning the spare bit of the code word, the flag indicating a change in a spare bit assignment associated with the code word retained in a subset of the MSRs that comprises the respective MSRs.

16. The apparatus of claim 10, wherein the instructions causing the apparatus to read the code word from the memory medium, when executed by the processor, cause the apparatus to:

retrieve the code word as part of a background operation independent of an access command from a host, wherein identifying the quantity of erroneous bits is based at least in part on retrieving the code word.

17. The apparatus of claim 10, wherein the instructions causing the apparatus to read the code word from the memory medium, when executed by the processor, cause the apparatus to:

retrieve a plurality of code words from a subset of the MSRs that comprises the respective MSRs by retrieving each code word serially, wherein identifying the quantity of erroneous bits is based at least in part on serially retrieving each code word.

18. A non-transitory computer-readable medium storing code, the code comprising instructions executable by a processor to:

read a code word from a memory medium that comprises a set of Minimum Substitution Regions (MSRs), the code word comprising a plurality of bits that each correspond to a respective MSR of the set;

identify a quantity of erroneous bits in the code word using an error control operation that is based at least in part on a size of one or more MSRs of the set;

set a value of a counter associated with an MSR of the set based at least in part on identifying the quantity of erroneous bits in the code word, the MSR of the set corresponding to an erroneous bit of the quantity;

determine the value of the counter relative to a threshold based at least in part on the value of the counter; and assign a spare bit of the code word to the erroneous bit of the quantity based at least in part on the value of the counter relative to the threshold.

19. The non-transitory computer-readable medium of claim 18, wherein the instructions are further executable by the processor to:

replace the erroneous bit of the quantity with the spare bit of the code word based at least in part on assigning the spare bit of the code word.

20. The non-transitory computer-readable medium of claim 18, wherein the instructions are further executable by the processor to:

write an indication of the spare bit assignment with respect to the erroneous bit of the quantity to a memory array of a port manager based at least in part on assigning the spare bit of the code word, the memory array configured to save a plurality of such indications associated with a plurality of spare bits in the code word.

* * * * *